(12) United States Patent
DeLano et al.

(10) Patent No.: US 12,352,734 B2
(45) Date of Patent: Jul. 8, 2025

(54) CHROMATOGRAPHIC HARDWARE IMPROVEMENTS FOR SEPARATION OF REACTIVE MOLECULES

(71) Applicant: Waters Technologies Corporation, Milford, MA (US)

(72) Inventors: Mathew DeLano, Needham, MA (US); Matthew A. Lauber, North Smithfield, RI (US); Kevin Wyndham, Upton, MA (US); Jennifer M. Nguyen, Uxbridge, MA (US)

(73) Assignee: Waters Technologies Corporation, Milford, MA (US)

( * ) Notice: Subject to any disclaimer, the term of this patent is extended or adjusted under 35 U.S.C. 154(b) by 333 days.

(21) Appl. No.: 17/484,157

(22) Filed: Sep. 24, 2021

(65) Prior Publication Data
US 2022/0091076 A1    Mar. 24, 2022

Related U.S. Application Data

(60) Provisional application No. 63/082,539, filed on Sep. 24, 2020.

(51) Int. Cl.
*G01N 30/60* (2006.01)
*C23C 16/02* (2006.01)
(Continued)

(52) U.S. Cl.
CPC ....... *G01N 30/603* (2013.01); *C23C 16/0281* (2013.01); *C23C 16/042* (2013.01); *C23C 16/26* (2013.01); *G01N 2030/027* (2013.01)

(58) Field of Classification Search
CPC ............ G01N 30/603; G01N 2030/027; C23C 16/0281; C23C 16/042; C23C 16/26
See application file for complete search history.

(56) References Cited

U.S. PATENT DOCUMENTS

| 2,801,186 A | 7/1957 | Alexander et al. |
| 4,207,188 A | 6/1980 | Tsuda et al. |

(Continued)

FOREIGN PATENT DOCUMENTS

| AU | 2020244497 A1 | 10/2020 |
| CA | 2538124 C | 7/2010 |

(Continued)

OTHER PUBLICATIONS

HASTELLOY datasheet (Year: 1997).*
(Continued)

*Primary Examiner* — Jennifer Bahls
*Assistant Examiner* — Quang X Nguyen
(74) *Attorney, Agent, or Firm* — WOMBLE BOND DICKINSON (US) LLP; Deborah M. Vernon; Ricardo Joseph

(57) ABSTRACT

The present disclosure relates to a method of reducing degradation of sample components in a liquid chromatography system. The method utilizes a masked metal frit to prevent or reduce metal surfaces from becoming catalytically active. The masked metal frit is a metal based frit that includes a coating on its exterior surfaces to mask or prevent contact between the organic solvents (and/or any analyte or other related solvent) and the underlying metal. The coating is a vapor deposited inorganic-organic hybrid coating, such as a vapor deposited C2 coating.

20 Claims, 21 Drawing Sheets

(51) Int. Cl.
    *C23C 16/04*       (2006.01)
    *C23C 16/26*       (2006.01)
    *G01N 30/02*       (2006.01)

(56) References Cited

U.S. PATENT DOCUMENTS

| | | | |
|---|---|---|---|
| 4,708,782 A | 11/1987 | Andresen et al. | |
| 4,711,820 A | 12/1987 | Arkles et al. | |
| 4,833,093 A | 5/1989 | Malmqvist et al. | |
| 4,945,282 A | 7/1990 | Kawamura et al. | |
| 4,999,162 A | 3/1991 | Wells et al. | |
| 5,002,794 A | 3/1991 | Ratner et al. | |
| 5,153,072 A | 10/1992 | Ratner et al. | |
| 5,470,463 A | 11/1995 | Girot et al. | |
| 5,550,184 A | 8/1996 | Halling | |
| 5,595,813 A | 1/1997 | Ogawa et al. | |
| 5,643,436 A | 7/1997 | Ogawa et al. | |
| 5,658,732 A | 8/1997 | Ebersole et al. | |
| 5,688,855 A | 11/1997 | Stoy et al. | |
| 5,856,192 A | 1/1999 | Bloch | |
| 5,876,753 A | 3/1999 | Timmons et al. | |
| 5,877,028 A | 3/1999 | Chandler et al. | |
| 5,909,314 A | 6/1999 | Oka et al. | |
| 6,013,372 A | 1/2000 | Hayakawa et al. | |
| 6,054,227 A | 4/2000 | Greenberg et al. | |
| 6,074,981 A | 6/2000 | Tada et al. | |
| 6,121,608 A | 9/2000 | Takada et al. | |
| 6,194,346 B1 | 2/2001 | Tada et al. | |
| 6,207,263 B1 | 3/2001 | Takematsu et al. | |
| RE37,183 E | 5/2001 | Kawamura et al. | |
| 6,265,026 B1 | 7/2001 | Wang | |
| 6,277,489 B1 | 8/2001 | Abbott et al. | |
| 6,306,506 B1 | 10/2001 | Timmons et al. | |
| 6,329,024 B1 | 12/2001 | Timmons et al. | |
| 6,329,209 B1 | 12/2001 | Wagner et al. | |
| 6,337,129 B1 | 1/2002 | Watanabe et al. | |
| 6,340,404 B1 | 1/2002 | Oka et al. | |
| 6,383,642 B1 | 5/2002 | Le Bellac et al. | |
| 6,436,682 B1 | 8/2002 | Bryan et al. | |
| 6,440,565 B1 | 8/2002 | Kim et al. | |
| 6,444,326 B1 | 9/2002 | Smith | |
| 6,461,334 B1 | 10/2002 | Buch-Rasmussen et al. | |
| 6,465,056 B1 | 10/2002 | Chabrecek et al. | |
| 6,482,531 B1 | 11/2002 | Timmons et al. | |
| 6,547,868 B1 | 4/2003 | Belmares et al. | |
| 6,599,594 B1 | 7/2003 | Walther et al. | |
| 6,645,378 B1 | 11/2003 | Liu et al. | |
| 6,660,338 B1 | 12/2003 | Hargreaves | |
| 6,686,035 B2 | 2/2004 | Jiang et al. | |
| 6,706,408 B2 | 3/2004 | Jelle | |
| 6,743,516 B2 | 6/2004 | Murphy et al. | |
| 6,763,437 B1 | 7/2004 | Nguyen et al. | |
| 6,783,800 B2 | 8/2004 | Saito et al. | |
| 6,844,028 B2 | 1/2005 | Mao et al. | |
| 6,873,387 B2 | 3/2005 | Hokazono et al. | |
| 6,905,772 B2 | 6/2005 | Shoup et al. | |
| 6,916,541 B2 | 7/2005 | Pantano et al. | |
| 6,991,826 B2 | 1/2006 | Pellerite et al. | |
| 7,067,194 B2 | 6/2006 | Mao et al. | |
| 7,138,186 B2 | 11/2006 | Luten, III | |
| 7,250,214 B2 | 7/2007 | Walter et al. | |
| 7,285,674 B2 | 10/2007 | Palma et al. | |
| 7,294,365 B2 | 11/2007 | Hayakawa et al. | |
| 7,351,477 B2 | 4/2008 | Yamaya et al. | |
| 7,387,836 B2 | 6/2008 | Gianolio et al. | |
| 7,413,774 B2 | 8/2008 | Kobrin et al. | |
| 7,419,636 B2 | 9/2008 | Aker et al. | |
| 7,419,699 B2 | 9/2008 | Kitada et al. | |
| 7,431,969 B2 | 10/2008 | Gleason et al. | |
| 7,553,514 B2 | 6/2009 | Fan et al. | |
| 7,629,029 B2 | 12/2009 | Mao et al. | |
| 7,638,167 B2 | 12/2009 | Kobrin et al. | |
| 7,662,936 B2 | 2/2010 | Kadkhodayan et al. | |
| 7,687,239 B2 | 3/2010 | Goldberg et al. | |
| 7,695,775 B2 | 4/2010 | Kobrin et al. | |
| 7,732,216 B2 | 6/2010 | Nochumson et al. | |
| 7,736,735 B2 | 6/2010 | Kanamori et al. | |
| 7,776,396 B2 | 8/2010 | Kobrin et al. | |
| 7,785,649 B2 | 8/2010 | Jung et al. | |
| 7,815,922 B2 | 10/2010 | Chaney et al. | |
| 7,842,393 B2 | 11/2010 | Kuzuya et al. | |
| 7,879,396 B2 | 2/2011 | Kobrin et al. | |
| 7,901,744 B2 | 3/2011 | Denes et al. | |
| 7,935,489 B2 | 5/2011 | O'Neill et al. | |
| 7,935,659 B2 | 5/2011 | Nova et al. | |
| 7,955,656 B2 | 6/2011 | Murayama et al. | |
| 7,955,704 B2 | 6/2011 | Lowery et al. | |
| 8,008,225 B2 | 8/2011 | Henze et al. | |
| 8,025,915 B2 | 9/2011 | Haines et al. | |
| 8,062,881 B2 | 11/2011 | Bookbinder et al. | |
| 8,105,821 B2 | 1/2012 | McGall et al. | |
| 8,147,954 B2 | 4/2012 | Lee et al. | |
| 8,163,354 B2 | 4/2012 | Dang et al. | |
| 8,178,168 B2 | 5/2012 | O'Neill et al. | |
| 8,178,602 B2 | 5/2012 | Mao et al. | |
| 8,323,166 B2 | 12/2012 | Haines et al. | |
| 8,349,408 B2 | 1/2013 | Dulka et al. | |
| 8,366,814 B2 | 2/2013 | Jones et al. | |
| 8,404,621 B2 | 3/2013 | Ikeda et al. | |
| 8,512,864 B2 | 8/2013 | Konno et al. | |
| 8,557,748 B2 | 10/2013 | Ikeda et al. | |
| 8,580,355 B2 | 11/2013 | Durandeau et al. | |
| 8,652,588 B2 | 2/2014 | Teer et al. | |
| 8,668,972 B2 | 3/2014 | Lewis et al. | |
| 8,691,104 B2 | 4/2014 | Greer et al. | |
| 8,709,588 B2 | 4/2014 | Cadet et al. | |
| 8,741,158 B2 | 6/2014 | Aytug et al. | |
| 8,778,278 B2 | 7/2014 | Xiong et al. | |
| 8,784,565 B2 | 7/2014 | Hillabrand et al. | |
| 8,795,787 B2 | 8/2014 | Jehle | |
| 8,841,070 B2 | 9/2014 | Harnack et al. | |
| 8,992,590 B2 | 3/2015 | Ott et al. | |
| 8,993,479 B2 | 3/2015 | Zuilhof et al. | |
| 8,999,156 B2 * | 4/2015 | Iraneta | G01N 30/603 210/656 |
| 9,034,660 B2 | 5/2015 | Boday et al. | |
| 9,075,189 B2 | 7/2015 | West | |
| 9,108,012 B2 | 8/2015 | Pryce Lewis et al. | |
| 9,175,026 B2 | 11/2015 | Garrell et al. | |
| 9,255,929 B2 | 2/2016 | Jiang et al. | |
| 9,272,095 B2 | 3/2016 | Felts et al. | |
| 9,308,520 B2 | 4/2016 | Ekeroth | |
| 9,340,880 B2 | 5/2016 | Mattzela | |
| 9,364,853 B2 | 6/2016 | Chen | |
| 9,388,315 B2 | 7/2016 | Hoshino | |
| 9,445,504 B2 | 9/2016 | Kang et al. | |
| 9,475,225 B2 | 10/2016 | Giraud et al. | |
| 9,523,004 B2 | 12/2016 | Hervieu et al. | |
| 9,533,006 B2 | 1/2017 | Jiang et al. | |
| 9,541,480 B2 | 1/2017 | Chang et al. | |
| 9,556,360 B2 | 1/2017 | McGall et al. | |
| 9,777,368 B2 | 10/2017 | Smith et al. | |
| 9,915,001 B2 | 3/2018 | Yuan et al. | |
| 9,925,521 B2 | 3/2018 | Wyndham et al. | |
| 9,926,203 B2 | 3/2018 | Zhou | |
| 9,975,143 B2 | 5/2018 | Smith et al. | |
| 9,999,901 B2 | 6/2018 | Boscher et al. | |
| 10,472,769 B2 | 11/2019 | Tuteja et al. | |
| 10,604,660 B2 | 3/2020 | Smith et al. | |
| 10,813,609 B2 | 10/2020 | Goto et al. | |
| 10,813,610 B2 | 10/2020 | Yoshida et al. | |
| 10,814,253 B2 | 10/2020 | Lipkens et al. | |
| 10,814,305 B2 | 10/2020 | Liao et al. | |
| 10,814,319 B2 | 10/2020 | Dasgupta et al. | |
| 10,814,320 B2 | 10/2020 | Le et al. | |
| 10,814,740 B2 | 10/2020 | Wilhide | |
| 10,815,247 B2 | 10/2020 | Flemming et al. | |
| 10,815,269 B2 | 10/2020 | Maloisel et al. | |
| 10,816,115 B2 | 10/2020 | Buerger et al. | |
| 10,816,476 B2 | 10/2020 | Nunney et al. | |
| 10,816,487 B2 | 10/2020 | Matney et al. | |
| 10,816,515 B2 | 10/2020 | Hollnagel et al. | |
| 10,816,518 B2 | 10/2020 | Jarrold et al. | |
| 10,816,786 B2 | 10/2020 | Douglas-Hamilton et al. | |

(56) References Cited

U.S. PATENT DOCUMENTS

| | | |
|---|---|---|
| 10,818,485 B2 | 10/2020 | Yamaguchi |
| 10,818,486 B2 | 10/2020 | Corr et al. |
| 10,828,665 B2 | 11/2020 | Stiff-Roberts et al. |
| 10,876,202 B2 | 12/2020 | Verbeck, IV et al. |
| 10,876,210 B1 | 12/2020 | Claussen et al. |
| 10,895,009 B2 | 1/2021 | Carr et al. |
| 10,912,714 B2 | 2/2021 | Weikart et al. |
| 11,435,327 B2 | 9/2022 | Matsumoto |
| 11,442,064 B2 | 9/2022 | Koskinen et al. |
| 11,511,213 B2 | 11/2022 | Belanger et al. |
| 2001/0021446 A1 | 9/2001 | Takematsu et al. |
| 2002/0016250 A1 | 2/2002 | Hayakawa et al. |
| 2002/0020053 A1 | 2/2002 | Fonash et al. |
| 2002/0026899 A1 | 3/2002 | McLaughlin et al. |
| 2002/0142621 A1 | 10/2002 | Wang |
| 2002/0172938 A1 | 11/2002 | Cuomo et al. |
| 2002/0195950 A1 | 12/2002 | Mikhael et al. |
| 2003/0049860 A1 | 3/2003 | Cholewa |
| 2003/0057154 A1 | 3/2003 | Gjerde et al. |
| 2003/0059573 A1 | 3/2003 | Timmons et al. |
| 2003/0109062 A1 | 6/2003 | Inomata et al. |
| 2003/0113477 A1 | 6/2003 | Timmons et al. |
| 2003/0138645 A1 | 7/2003 | Gleason et al. |
| 2004/0261703 A1 | 12/2004 | Kobrin et al. |
| 2005/0118595 A1 | 6/2005 | Lahann |
| 2005/0164402 A1 | 7/2005 | Belisle et al. |
| 2005/0214803 A1 | 9/2005 | Wang |
| 2006/0073521 A1 | 4/2006 | Saito et al. |
| 2006/0110594 A1 | 5/2006 | Frutos et al. |
| 2006/0213441 A1 | 9/2006 | Kobrin et al. |
| 2006/0219598 A1 | 10/2006 | Cody et al. |
| 2006/0251795 A1 | 11/2006 | Kobrin et al. |
| 2007/0031854 A1 | 2/2007 | Katsilometes |
| 2007/0048747 A1 | 3/2007 | Leslie et al. |
| 2007/0065591 A1 | 3/2007 | Parbhu |
| 2007/0122308 A1 | 5/2007 | Ikeda et al. |
| 2007/0172666 A1 | 7/2007 | Denes et al. |
| 2007/0254378 A1 | 11/2007 | Zhang et al. |
| 2008/0041105 A1 | 2/2008 | Hahn et al. |
| 2008/0075960 A1 | 3/2008 | Pocius et al. |
| 2008/0085528 A1 | 4/2008 | Marcinkeviciene et al. |
| 2008/0170230 A1 | 7/2008 | Gerion |
| 2008/0188010 A1 | 8/2008 | Saitoh et al. |
| 2008/0248589 A1 | 10/2008 | Belisle et al. |
| 2008/0312356 A1 | 12/2008 | Kobrin et al. |
| 2009/0020712 A1 | 1/2009 | Matsumoto |
| 2009/0078633 A1 | 3/2009 | Chen et al. |
| 2009/0081371 A1 | 3/2009 | Minami et al. |
| 2009/0137526 A1 | 5/2009 | Jubert et al. |
| 2009/0162571 A1 | 6/2009 | Haines et al. |
| 2009/0176084 A1 | 7/2009 | Yoshihara et al. |
| 2009/0206034 A1 | 8/2009 | Nakajima |
| 2009/0286435 A1 | 11/2009 | Badyal et al. |
| 2009/0318609 A1 | 12/2009 | Badyal et al. |
| 2010/0038298 A1 | 2/2010 | Angelini et al. |
| 2010/0080903 A1 | 4/2010 | Tamitsuji et al. |
| 2010/0178512 A1 | 7/2010 | Giesenberg et al. |
| 2010/0196724 A1 | 8/2010 | Yamasaki et al. |
| 2010/0200207 A1 | 8/2010 | Fukuda et al. |
| 2010/0203646 A1 | 8/2010 | Larsen et al. |
| 2010/0282077 A1 | 11/2010 | Jones et al. |
| 2010/0285596 A1 | 11/2010 | Yu et al. |
| 2010/0330278 A1 | 12/2010 | Choi et al. |
| 2011/0000658 A1 | 1/2011 | Tanaka et al. |
| 2011/0062047 A1 | 3/2011 | Haines et al. |
| 2011/0120213 A1 | 5/2011 | Hirayama et al. |
| 2011/0120940 A1 | 5/2011 | Allen et al. |
| 2011/0189493 A1 | 8/2011 | Ott et al. |
| 2011/0295033 A1 | 12/2011 | Mayorga et al. |
| 2012/0069295 A1 | 3/2012 | Fukagawa et al. |
| 2012/0100546 A1 | 4/2012 | Lowery, Jr. et al. |
| 2012/0123345 A1 | 5/2012 | Felts et al. |
| 2012/0132794 A1 | 5/2012 | Buchanan et al. |
| 2012/0178848 A1 | 7/2012 | Adkinson et al. |
| 2012/0183799 A1* | 7/2012 | Steele ................... B22F 7/02 427/601 |
| 2012/0219697 A1 | 8/2012 | Chen |
| 2012/0219727 A1 | 8/2012 | Gandhiraman et al. |
| 2012/0251797 A1 | 10/2012 | Smith et al. |
| 2012/0252709 A1 | 10/2012 | Felts et al. |
| 2012/0288717 A1 | 11/2012 | Mao et al. |
| 2012/0298585 A1 | 11/2012 | Ritchie et al. |
| 2013/0004780 A1 | 1/2013 | Hervieu et al. |
| 2013/0025503 A1 | 1/2013 | Park et al. |
| 2013/0029138 A1 | 1/2013 | Benard et al. |
| 2013/0090260 A1 | 4/2013 | Nova et al. |
| 2013/0136937 A1 | 5/2013 | Fujii et al. |
| 2013/0157062 A1 | 6/2013 | Kihara et al. |
| 2013/0174642 A1 | 7/2013 | Bourlon et al. |
| 2013/0244025 A1 | 9/2013 | Smith et al. |
| 2013/0266762 A1 | 10/2013 | Mayers et al. |
| 2013/0337226 A1 | 12/2013 | Curran et al. |
| 2014/0004022 A1 | 1/2014 | Sagona et al. |
| 2014/0065368 A1 | 3/2014 | Aytug et al. |
| 2014/0147631 A1 | 5/2014 | Yang et al. |
| 2014/0154399 A1 | 6/2014 | Weikart et al. |
| 2014/0187666 A1 | 7/2014 | Aizenberg et al. |
| 2014/0202355 A1 | 7/2014 | Hoshino |
| 2014/0287240 A1 | 9/2014 | Murotani et al. |
| 2014/0299538 A1 | 10/2014 | Gleason et al. |
| 2014/0318748 A1 | 10/2014 | Svensson et al. |
| 2014/0323981 A1 | 10/2014 | Giraud et al. |
| 2014/0342954 A1 | 11/2014 | Ingber et al. |
| 2014/0357091 A1 | 12/2014 | Mattzela |
| 2014/0370300 A1 | 12/2014 | Smith |
| 2015/0021339 A1 | 1/2015 | Felts et al. |
| 2015/0024152 A1 | 1/2015 | Carr et al. |
| 2015/0030885 A1 | 1/2015 | Smith |
| 2015/0064376 A1 | 3/2015 | Smith et al. |
| 2015/0064451 A1 | 3/2015 | Kalaga et al. |
| 2015/0098084 A1 | 4/2015 | Felts et al. |
| 2015/0118502 A1 | 4/2015 | Mitsuhashi et al. |
| 2015/0118504 A1 | 4/2015 | Ohshita et al. |
| 2015/0122365 A1 | 5/2015 | Carr et al. |
| 2015/0152124 A1 | 6/2015 | Mori et al. |
| 2015/0175814 A1 | 6/2015 | Aizenberg et al. |
| 2015/0209846 A1 | 7/2015 | Aizenberg et al. |
| 2015/0210951 A1 | 7/2015 | Aizenberg et al. |
| 2015/0232806 A1 | 8/2015 | Jung et al. |
| 2015/0239773 A1 | 8/2015 | Aytug |
| 2015/0247051 A1 | 9/2015 | Ha et al. |
| 2015/0273522 A1 | 10/2015 | Boscher et al. |
| 2015/0283307 A1 | 10/2015 | Smith et al. |
| 2015/0298165 A1 | 10/2015 | Smith |
| 2015/0307525 A1 | 10/2015 | Higano et al. |
| 2015/0307719 A1 | 10/2015 | Mitsuhashi et al. |
| 2015/0309216 A1 | 10/2015 | Fournand |
| 2015/0322272 A1 | 11/2015 | Pokroy et al. |
| 2015/0329725 A1 | 11/2015 | Liu |
| 2016/0002488 A1 | 1/2016 | Takao et al. |
| 2016/0002489 A1 | 1/2016 | Gleason et al. |
| 2016/0017397 A1 | 1/2016 | Roy et al. |
| 2016/0038972 A1 | 2/2016 | Lu |
| 2016/0040039 A1 | 2/2016 | Yamane et al. |
| 2016/0059260 A1 | 3/2016 | Smith et al. |
| 2016/0074862 A1 | 3/2016 | Breaux et al. |
| 2016/0082435 A1 | 3/2016 | Bunner et al. |
| 2016/0168021 A1 | 6/2016 | Goh et al. |
| 2016/0200941 A1 | 7/2016 | Liu et al. |
| 2016/0231594 A1 | 8/2016 | Ang et al. |
| 2016/0243308 A1 | 8/2016 | Giraud et al. |
| 2016/0251261 A1 | 9/2016 | Bureau |
| 2016/0289824 A1 | 10/2016 | Mattzela et al. |
| 2016/0302723 A1 | 10/2016 | Chen |
| 2016/0340544 A1 | 11/2016 | Katsukawa et al. |
| 2017/0001956 A1 | 1/2017 | Chau et al. |
| 2017/0044315 A1 | 2/2017 | Mitsuhashi et al. |
| 2017/0173223 A1 | 6/2017 | Delaney, Jr. et al. |
| 2018/0049644 A1 | 2/2018 | Themelis |
| 2018/0357402 A1 | 12/2018 | Omata et al. |
| 2019/0032201 A1 | 1/2019 | Smith et al. |
| 2019/0077966 A1 | 3/2019 | Koguchi et al. |
| 2019/0086371 A1* | 3/2019 | Lauber ................ B01J 20/3272 |

(56) References Cited

U.S. PATENT DOCUMENTS

| | | |
|---|---|---|
| 2019/0262745 A1 | 8/2019 | Bischof et al. |
| 2019/0271711 A1 | 9/2019 | Egan et al. |
| 2019/0390329 A1 | 12/2019 | Carr et al. |
| 2020/0024155 A1 | 1/2020 | Kano et al. |
| 2020/0024156 A1 | 1/2020 | Kano et al. |
| 2020/0024157 A1 | 1/2020 | Kano et al. |
| 2020/0025729 A1 | 1/2020 | Milburn et al. |
| 2020/0062615 A1 | 2/2020 | Rajagopalan et al. |
| 2020/0109297 A1 | 4/2020 | McDaniel |
| 2020/0189938 A1 | 6/2020 | Kano et al. |
| 2020/0215457 A1 | 7/2020 | DeLano et al. |
| 2020/0239641 A1 | 7/2020 | Kawakami et al. |
| 2020/0269157 A1 | 8/2020 | DeLano et al. |
| 2020/0328073 A1 | 10/2020 | Peterson et al. |
| 2020/0332801 A1 | 10/2020 | Kimura |
| 2020/0333265 A1 | 10/2020 | Doki et al. |
| 2020/0333369 A1 | 10/2020 | Toyoda et al. |
| 2020/0334792 A1 | 10/2020 | Themelis |
| 2020/0335902 A1 | 10/2020 | Tanaka |
| 2020/0337659 A1 | 10/2020 | Sano et al. |
| 2020/0338528 A1 | 10/2020 | Dong et al. |
| 2020/0339322 A1 | 10/2020 | Christensen et al. |
| 2020/0339665 A1 | 10/2020 | Bruhlmann et al. |
| 2020/0339931 A1 | 10/2020 | Bremer et al. |
| 2020/0339977 A1 | 10/2020 | Lebofsky et al. |
| 2020/0339980 A1 | 10/2020 | Dellinger et al. |
| 2020/0340047 A1 | 10/2020 | Mollerup |
| 2020/0340468 A1 | 10/2020 | Kuntz et al. |
| 2020/0340889 A1 | 10/2020 | Mlcak et al. |
| 2020/0340890 A1 | 10/2020 | Mlcak |
| 2020/0340910 A1 | 10/2020 | Handique |
| 2020/0340946 A1 | 10/2020 | Bateman et al. |
| 2020/0340949 A1 | 10/2020 | Mlcak et al. |
| 2020/0340950 A1 | 10/2020 | Mlcak et al. |
| 2020/0340956 A1 | 10/2020 | Ortmann et al. |
| 2020/0340959 A1 | 10/2020 | Schultz et al. |
| 2020/0340961 A1 | 10/2020 | Kunimura |
| 2020/0340982 A1 | 10/2020 | Levin et al. |
| 2020/0341253 A1 | 10/2020 | Foelling |
| 2020/0341255 A1 | 10/2020 | Chan |
| 2020/0341259 A1 | 10/2020 | Chan et al. |
| 2020/0341278 A1 | 10/2020 | Tanaka |
| 2020/0341378 A1 | 10/2020 | Wolterink et al. |
| 2020/0342326 A1 | 10/2020 | Rahnama Moghaddam |
| 2020/0342672 A1 | 10/2020 | Schmelig et al. |
| 2020/0343082 A1 | 10/2020 | Richardson et al. |
| 2020/0348307 A1 | 11/2020 | Beierle et al. |
| 2020/0365237 A1 | 11/2020 | Madden et al. |
| 2020/0375846 A1 | 12/2020 | Chang et al. |
| 2021/0009817 A1 | 1/2021 | Poulet et al. |
| 2021/0009883 A1 | 1/2021 | Tuteja et al. |
| 2021/0032157 A1 | 2/2021 | Czihal et al. |
| 2021/0061049 A1 | 3/2021 | Lekon et al. |
| 2021/0098233 A1 | 4/2021 | Kapoor et al. |
| 2021/0101176 A1 | 4/2021 | Baltazar et al. |
| 2021/0108252 A1 | 4/2021 | Beverly |

FOREIGN PATENT DOCUMENTS

| | | |
|---|---|---|
| CA | 2881275 C | 10/2020 |
| CA | 2855353 C | 1/2021 |
| CN | 104327663 A | 2/2015 |
| CN | 109225113 A | 1/2019 |
| CN | 109608680 A | 4/2019 |
| CN | 111471977 A | 7/2020 |
| CN | 111560172 A | 8/2020 |
| CN | 111848755 A | 10/2020 |
| CN | 111855826 A | 10/2020 |
| CN | 111855827 A | 10/2020 |
| CN | 111863585 A | 10/2020 |
| CN | 111944153 A | 11/2020 |
| CN | 112011055 A | 12/2020 |
| CN | 112264272 A | 1/2021 |
| EP | 1816155 B1 | 6/2011 |
| EP | 2587258 A1 | 5/2013 |
| EP | 2608219 B1 | 3/2015 |
| EP | 2915833 A1 | 9/2015 |
| EP | 3573646 A1 | 12/2019 |
| EP | 3633366 A1 | 4/2020 |
| EP | 2403621 B1 | 10/2020 |
| EP | 2798664 B1 | 10/2020 |
| EP | 2834837 B1 | 10/2020 |
| EP | 2900819 B1 | 10/2020 |
| EP | 3006980 B1 | 10/2020 |
| EP | 3060325 B1 | 10/2020 |
| EP | 3131657 B1 | 10/2020 |
| EP | 3139150 B1 | 10/2020 |
| EP | 3169232 B1 | 10/2020 |
| EP | 3169424 B1 | 10/2020 |
| EP | 3273674 B1 | 10/2020 |
| EP | 3344317 B1 | 10/2020 |
| EP | 3399074 B1 | 10/2020 |
| EP | 3545085 A4 | 10/2020 |
| EP | 3727152 A1 | 10/2020 |
| EP | 3727637 A1 | 10/2020 |
| EP | 3727679 A1 | 10/2020 |
| EP | 3727690 A1 | 10/2020 |
| EP | 3728046 A1 | 10/2020 |
| EP | 3728581 A1 | 10/2020 |
| EP | 3728621 A2 | 10/2020 |
| EP | 3728633 A1 | 10/2020 |
| EP | 3729055 A1 | 10/2020 |
| EP | 3729071 A1 | 10/2020 |
| EP | 3729077 A1 | 10/2020 |
| EP | 3729083 A1 | 10/2020 |
| EP | 3729162 A1 | 10/2020 |
| EP | 3729487 A1 | 10/2020 |
| EP | 3729488 A2 | 10/2020 |
| EP | 3730119 A1 | 10/2020 |
| EP | 3730324 A1 | 10/2020 |
| EP | 3730406 A1 | 10/2020 |
| EP | 3730538 A1 | 10/2020 |
| EP | 3730599 A1 | 10/2020 |
| EP | 3730922 A1 | 10/2020 |
| EP | 3730923 A1 | 10/2020 |
| EP | 3730927 A1 | 10/2020 |
| EP | 3731393 A1 | 10/2020 |
| EP | 3749719 A1 | 12/2020 |
| EP | 3788181 A1 | 3/2021 |
| FR | 3095337 A1 | 10/2020 |
| GB | 2108403 A | 5/1983 |
| GB | 2429428 A | 2/2007 |
| GB | 2481687 A | 1/2012 |
| GB | 2490243 A | 10/2012 |
| GB | 2501803 A | 11/2013 |
| GB | 2531126 A | 4/2016 |
| GB | 2549248 A | 10/2017 |
| GB | 2534477 B | 10/2020 |
| GB | 2574723 B | 10/2020 |
| IL | 174122 A | 9/2011 |
| IL | 239213 A | 3/2020 |
| IL | 253518 A | 6/2020 |
| IL | 262854 A | 6/2020 |
| JP | 2012232870 A | 11/2012 |
| JP | 2017516650 A | 6/2017 |
| JP | 2020507460 A | 3/2020 |
| JP | 2020507462 A | 3/2020 |
| JP | 2020507466 A | 3/2020 |
| JP | 2020510522 A | 4/2020 |
| JP | 6770727 B2 | 10/2020 |
| JP | 6771390 B2 | 10/2020 |
| JP | 6771801 B2 | 10/2020 |
| JP | 6772721 B2 | 10/2020 |
| JP | 6772764 B2 | 10/2020 |
| JP | 6772953 B2 | 10/2020 |
| JP | 6773138 B2 | 10/2020 |
| JP | 6773236 B2 | 10/2020 |
| JP | 2020169857 A | 10/2020 |
| JP | 2020171429 A | 10/2020 |
| JP | 2020171482 A | 10/2020 |
| JP | 2020171483 A | 10/2020 |
| JP | 2020171484 A | 10/2020 |
| JP | 2020171882 A | 10/2020 |
| JP | 2020172518 A | 10/2020 |

(56) References Cited

FOREIGN PATENT DOCUMENTS

| | | |
|---|---|---|
| JP | 2020172703 A | 10/2020 |
| JP | 2020173192 A | 10/2020 |
| JP | 2020173427 A | 10/2020 |
| JP | 2020176195 A | 10/2020 |
| JP | 2020177669 A | 10/2020 |
| JP | 2020530329 A | 10/2020 |
| JP | 2020530909 A | 10/2020 |
| JP | 2020536764 A | 12/2020 |
| KR | 960007179 B1 | 5/1996 |
| KR | 20000019936 A | 4/2000 |
| KR | 20060130959 A | 12/2006 |
| KR | 20080071942 A | 8/2008 |
| KR | 20090103323 A | 10/2009 |
| KR | 20120007817 A | 1/2012 |
| KR | 20130020869 A | 3/2013 |
| KR | 20140082838 A | 7/2014 |
| KR | 101711786 B1 | 3/2017 |
| KR | 20170021957 A | 3/2017 |
| KR | 101742683 B1 | 6/2017 |
| KR | 20200139842 A | 12/2020 |
| KR | 20210008523 A | 1/2021 |
| KR | 102218186 B1 | 2/2021 |
| KR | 20210013582 A | 2/2021 |
| TW | 202031738 A | 9/2020 |
| TW | 202039644 A | 11/2020 |
| WO | 199119982 A1 | 12/1991 |
| WO | 1998017407 A1 | 4/1998 |
| WO | 1999040038 A1 | 8/1999 |
| WO | 199951773 A1 | 10/1999 |
| WO | 200032044 A1 | 6/2000 |
| WO | 200168240 A2 | 9/2001 |
| WO | 2002085250 A2 | 10/2002 |
| WO | 2002085330 A1 | 10/2002 |
| WO | 2003104394 A2 | 12/2003 |
| WO | 2006015982 A2 | 2/2006 |
| WO | 2006121295 A1 | 11/2006 |
| WO | 2007081387 A1 | 7/2007 |
| WO | 2007117191 A1 | 10/2007 |
| WO | 2007117213 A1 | 10/2007 |
| WO | 2007117214 A1 | 10/2007 |
| WO | 2009007150 A2 | 1/2009 |
| WO | 2010009311 A1 | 1/2010 |
| WO | 2010135660 A2 | 11/2010 |
| WO | 2012170549 A1 | 12/2012 |
| WO | 2013064754 A1 | 5/2013 |
| WO | 2014104495 A1 | 7/2014 |
| WO | 2014104573 A1 | 7/2014 |
| WO | 2014164928 A1 | 10/2014 |
| WO | 2015050449 A2 | 4/2015 |
| WO | 2015054652 A2 | 4/2015 |
| WO | WO-2015086799 A1 * 6/2015 ......... G01N 30/6026 |
| WO | 2015134488 A1 | 9/2015 |
| WO | 2016100923 A1 | 6/2016 |
| WO | 2016114850 A1 | 7/2016 |
| WO | 2016125272 A1 | 8/2016 |
| WO | 2016160702 A1 | 10/2016 |
| WO | 2016166816 A1 | 10/2016 |
| WO | 2017040623 A1 | 3/2017 |
| WO | 2017053891 A1 | 3/2017 |
| WO | 2017060991 A1 | 4/2017 |
| WO | 2017072893 A1 | 5/2017 |
| WO | 2017087032 A1 | 5/2017 |
| WO | 2017098758 A1 | 6/2017 |
| WO | 2017143246 A1 | 8/2017 |
| WO | 2017171546 A1 | 10/2017 |
| WO | 2017189357 A2 | 11/2017 |
| WO | 2017210223 A1 | 12/2017 |
| WO | 2018072862 A1 | 4/2018 |
| WO | 2018146318 A1 | 8/2018 |
| WO | 2018202935 A1 | 11/2018 |
| WO | 2019053693 A1 | 3/2019 |
| WO | 2019063482 A1 | 4/2019 |
| WO | 2019101980 A1 | 5/2019 |
| WO | 2019116619 A1 | 6/2019 |
| WO | 2019122100 A1 | 6/2019 |
| WO | 2019126130 A1 | 6/2019 |
| WO | 2019130536 A1 | 7/2019 |
| WO | 2019138705 A1 | 7/2019 |
| WO | 2019150573 A1 | 8/2019 |
| WO | 2019152724 A1 | 8/2019 |
| WO | 2019154758 A1 | 8/2019 |
| WO | 2019155543 A1 | 8/2019 |
| WO | 2019155545 A1 | 8/2019 |
| WO | 2019165297 A1 | 8/2019 |
| WO | 2019168989 A1 | 9/2019 |
| WO | 2019171085 A1 | 9/2019 |
| WO | 2019175441 A1 | 9/2019 |
| WO | 2019176081 A1 | 9/2019 |
| WO | 2019180045 A1 | 9/2019 |
| WO | 2019185607 A1 | 10/2019 |
| WO | 2019186999 A1 | 10/2019 |
| WO | 2019191269 A1 | 10/2019 |
| WO | 2019191587 A2 | 10/2019 |
| WO | 2019193558 A1 | 10/2019 |
| WO | 2019198280 A1 | 10/2019 |
| WO | 2019200306 A1 | 10/2019 |
| WO | 2019212799 A1 | 11/2019 |
| WO | 2019218088 A1 | 11/2019 |
| WO | 2019224201 A1 | 11/2019 |
| WO | 2019224540 A1 | 11/2019 |
| WO | 2019229171 A1 | 12/2019 |
| WO | 2019238469 A1 | 12/2019 |
| WO | 2019241394 A1 | 12/2019 |
| WO | 2020068174 A2 | 4/2020 |
| WO | 2020095566 A1 | 5/2020 |
| WO | 2020104521 A2 | 5/2020 |
| WO | 2020213061 A1 | 10/2020 |
| WO | 2020213101 A1 | 10/2020 |
| WO | 2020213209 A1 | 10/2020 |
| WO | 2020216966 A1 | 10/2020 |
| WO | 2020219451 A1 | 10/2020 |
| WO | 2020219605 A1 | 10/2020 |
| WO | 2020219659 A1 | 10/2020 |
| WO | 2020219667 A1 | 10/2020 |
| WO | 2020219671 A1 | 10/2020 |
| WO | 2020219784 A1 | 10/2020 |
| WO | 2020219869 A1 | 10/2020 |
| WO | 2021019220 A1 | 2/2021 |
| WO | 2021061049 A1 | 4/2021 |
| WO | 2021072245 A1 | 4/2021 |

OTHER PUBLICATIONS

Bohlin. "Surface and Porous Structure of Pigment Coatings, Interactions with flexographic ink and effects of print quality." Dissertation: Karlstad University Studies. (2013).
Faucheu et al. "Relating Gloss Loss to Topographical Features of a PVDF Coating." (2004).
Myers et al. "On-column nitrosation of amines observed in liquid chromatography impurity separations employing ammonium hydroxide and acetonitrile as mobile phase." J. Chromatogr. A. 1319(2013): 57-64.
Invitation to Pay Additional Fees and, Where Appliable, Protest Fee issued in International Application No. PCT/IB2021/058741 dated Dec. 23, 2021.
"Carboxy-silane triol." PubChem, Aug. 12, 2023.
"Corrosion Resistant Coating Properties: Extend Product Life, Prevent Contamination." SilcoTek. 2023.
"Electrical Property Characterization of SilcoTek Coatings." Retrieved on Jul. 31, 2023.
"High Purity Coatings, the Secret Weapon in Semiconductor Manufacturing." SilcoTek, Dec. 12, 2014.
"How Corrosion Resistant Is Dursan? Let's Find Out." SilcoTek. Jan. 23, 2025.
"How to Identify and Prevent Fouling (HPL)". SilcoTek. Jun. 22, 2017.
Reliable Sampling & Transfer of Sulfur Passivation vs. Inert Coatings. SilcoTek. Jun. 16, 2011.
"Silane Coupling Agents: Connecting Across Boundaries." Gelest, Inc. 2014.

(56) References Cited

OTHER PUBLICATIONS

"Solving Surface Fouling with New Non-Stick CVD Coatings." SilcoTek. Aug. 31, 2017.
"Specialty Coatings." https://geniefilters.com/news-room/specialty-coatings. Dec. 29, 2013.
"Visit Us at Pittcon: Make Your HPLC System Faster & More Reliable." SilcoTek. Mar. 3, 2017.
"What's SilcoTek Talking About at Pittcon 2018." SilcoTek. Feb. 16, 2018.
Al-Hamarneh et al. "Synthesis and characterization of di(ethylene glycol) vinyl ether films deposited by atmospheric pressure corona discharge plasma." Surface Coatings Technol. 234(2013):33-41.
Barone et al. "Characterizing the Performance of Surface Modifications that Enhance Sensitivty, Reliability, Reproducibility and Accuracy of Analytical Instruments." (2011).
Barone et al. "Improving Reliability of Analytical and Sampling Systems in Challenges and Corrosive Environments." (2011).
Barone. "Corrosion Control and Chemically inert nano-coatings for use in refining, petrochemical and analytical equipment industries." 2021.
Barone. "Exciting Developments in Silicon Barrier Coatings for Semicon." SllcokTek. Jul. 15, 2015.
Beigbeder et al. "Marine Fouling Release Silicone/Carbon Nanotube Nanocomposite Coatings: On the Importance of the Nanotube Dispersion State." J. Nanosci. Nanotech, 10(2010): 2972-2978.
Biocyl™ X1, Dec. 20, 2018.
Bischof. "Achieving PEEK-like Performance on Stainless Steel HPLC Components with Bio-Inert CVD Coatings." SilcoTek. Feb. 28, 2019.
Brown et al. "Sampling of gaseous sulfur-containing compounds at low concentrations with a review of best-practice methods for biogas and natural gas applications." Trends Anal. Chem. 64(2015): 42-52.
Buchmeiser. "New synthetic ways for the preparation of high-performance liquid chromatography supports." J. Chromatogr. A. 918(2001): 233-266.
Carretier et al. "Design of PVDF/PEGMA-b-PS-b-PEGMA membranes by VIPS for improved biofouling mitigation." J. Membrane Sci. 510(2016):355-369.
Cheong. "Fritting techniques in chromatography." J. Sep. Sci. 37(2014): 603-617.
Colic et al. "Synergistic Application of Chemical and Electromagnetic Water Treatment in Corrosion and Scale Prevention." Croatiia Chem. Acta. 71.4(1998): 905-916.
Conroy. "Nanostructed surfaces for sening heavy metals and radionuclides in aqueous systems." Doctorate thesis—Philosophy—The University of Leeds. Oct. 2012.
Dursan: An Inert and Corrosion Resistant High Performance CVD Coating. SilcoTek. Retrieved on Jul. 31, 2023.
Dursan® and SilcoNert® 2000 Coating Comparison Guide. (2000).
Dursan® Coating Data Sheet. 2022.
Dursan® Coating Data Sheet. Jun. 1, 2021.
Dursan® Coating for Improved, Metal-Free Liquid Chromatography. Dec. 20, 2018.
Dursan® Data Sheet 2018.
Gosetti et al. "Signal suppression/enhancement in high-performance liquid chromatography tandem mass spectrometry." J. Chromatogr. A. 1217(2010): 3929-3937.
Hayes et al. "Core-shell particles: Preparation fundamentals and applications in high performance liquid chromatography." J. Chromatogr. A. 1357(2014): 36-52.
HPLC Hardware. Möller Medical. (2007).
Hsieh et al. "Effective Enhancement of Fluorescence Detection Efficiency in Protein Microarray Assays: Application of a Highly Fluorinated Organosilane as the Blocking Agent on the Background Surface by a Facile Vapor-Phase Deposition Process." Anal. Chem. 81(2009): 7908-7916.
International Search Report and Written Opinion issued in International Application No. PCT/IB2021/059534 dated Mar. 10, 2022.
Kaliaraj et al. "Bio-inspired YSZ coated titanium by EB-PVD for biomedical applications." Surface and Coatings Technol. 307(2016): 227-235.
Kanavarioti et al. "HPLC methods for purity evaluation of man-made single-stranded RNAs." Nature. 9(2019): 1019.
Kong. "Measuring the Electrostatic Repulsion Forces Beween Glycosaminoglycans Using the Atomic Force Microscope." Masters Thesis—Department of Materials Science Engineering at Massachusetts Institute of Technology, Sep. 1999.
Lauber et al. "Rapid Preparation of Released N-Glycans for HILIC Analysis Using a Labeling Reagent that Facilitates Sensitive Fluorescence and ESI-MS Detection." Anal Chem. 87.10(2015): 5401-9.
Lecloux et al. "The safe use of carbon nanotubes in coating applications." OECD Conference on Benefits of nanomaterials. Paris, Jul. 15-17, 2009.
NanoCoatings Product Information. Möller Medical. (2010).
Ntrouka et al. "The effect of chemotherapeutic agents on contaminated titanium surfaces: a systematic review." Clin. Oral Impl. Res. 22(2011): 681-690.
Paleologos et al. "Micelle-mediated separation and cloud-point extraction." Trends Anal. Chem. 24.5(2005): 426-436.
Pfaunmiller et al. "Affinity monolith chromatography: A review of principles and recent analytical applications." Anal. Bionanal. Chem. 405.7(2013): 2133-2145.
Pirok et al. "Pratical Approaches to Overcome the Challenges of Comprehensive Two-Dimensional Liquid Chromatography." LCGC Europe. 31.5(2018): 242-249.
Pirok et al."Recent Developments in Two-Dimensional Liquid Chromatography: Fundamental Improvements for Practical Applications." Anal. Chem. 91.1(2019): 240-263.
Rahimi et al. "Application of copolymer coated frits for solid-phase extraction of poly cyclic aromatic hydrocarbons in water samples." Anal. Chim. Acta. 836(2014): 45-52.
Rivera et al. "Bioinert Versus Biocompatible: The Benefits of Different Column Materials in Liquid Chromatography Separations." LCGC Suppl. 36.6(2018).
Rosmaninho et al. "Modified stainless steel surfaces targeted to reduce fouling—Evaluation of fouling by milk components." J. Food Engineering. 80(2007): 1176-1187.
Shih et al. "Silanization of Stainless-Steel Frits for Use in Trace Metal Analysis by High Performance Liquid Chromatography." Talanta. 28(1981): 411-414.
SilcoTek Coating Properties: A Comprehensive Analysis of Coating Characteristics and Properties. e-book. Retrieved 2023.
Silco Tek Intellectual Property, Patents and Trademarks. Retrieved Jul. 31, 2023.
SilcoTek® Non-Stick CVD Coatings,. Retrieved Jul. 31, 2023.
Sun et al. "Vapor-based Grafting of Crosslinked Poly(N-vinyl pyrrolidone) Coatings with Tuned Hydrophilicity and Anti-Biofouling Properties." J. Mater. Chem. B. 4(2016): 2669-2678.
Technical Program, Agenda of Sessions: Abstract PDF. Pittcon, Atlanta, GA, Mar. 6-10, 2016.
Vaidya et al. "Protein-Resistant Properties of SilcoTek's Dursan® Coating." SilcoTek. (2017).
Vaidya et al. Protein-resistant properties of a chemical vapor deposited alkyl-functional carboxysilane coating characterized using quartz crystal microbalance. Appl. Surface Sci. 364(2016): 896-908.
Velox Plus, Dec. 20, 2018.
Waters Quality Parts®, Chromatography Columns and Supplies Catalog. Dec. 2014.
Wyndham et al. "Characterization and Evaluation of C18 HPLC Stationary Phases Based on Ethyl-Bridged Hybrid Organic/Inorganic Particles." Anal. Chem. 75.24(2003): 6781-6788.
Xue et al. "Surface-modified anodic aluminum oxide membrane with hydroxyethyl celluloses as a matrix for bilirubin removal." J. Chromatog. B. 912(2013):1-7.
Yang et al. "Synergistic Prevention of Biofouling in Seawater Desalination by Zwitterionic Surfaces and Low-Level Chloronation." Adv. Mater. 26(2014): 1711-1718.

\* cited by examiner

2 E
Nitroso Impurity
E isomer

2 Z
Nitroso Impurity
Z isomer

1
Litronesib
LY2523355

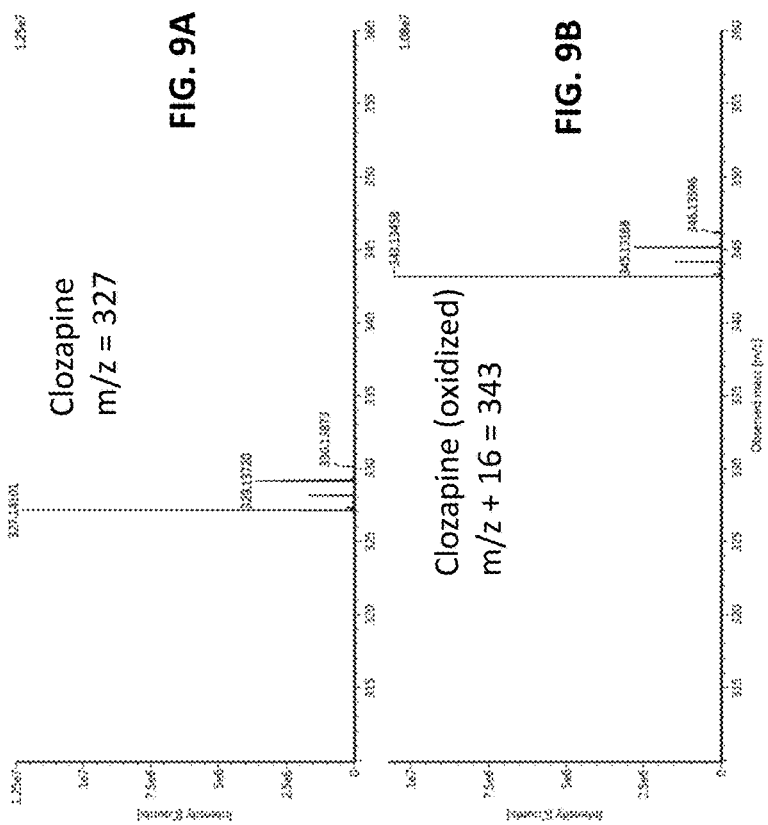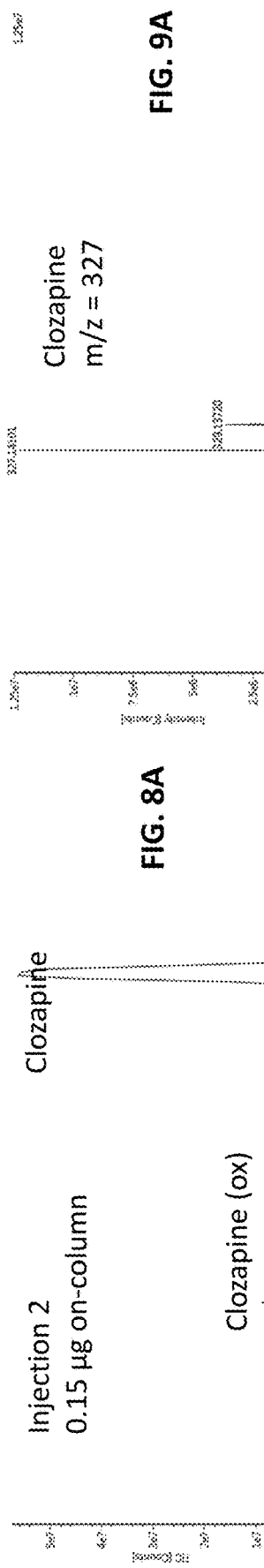

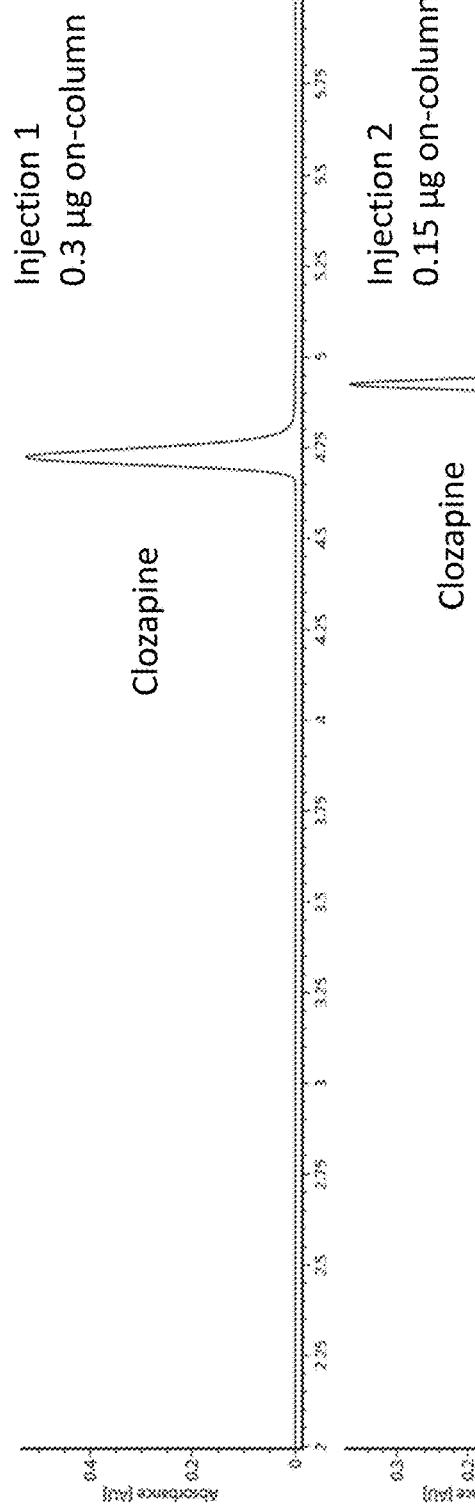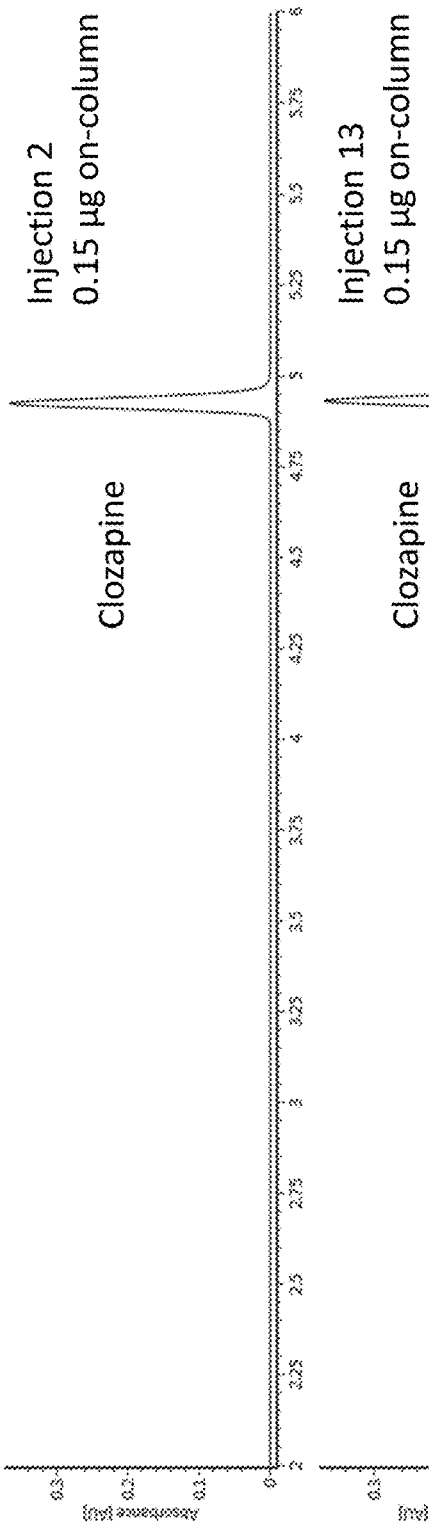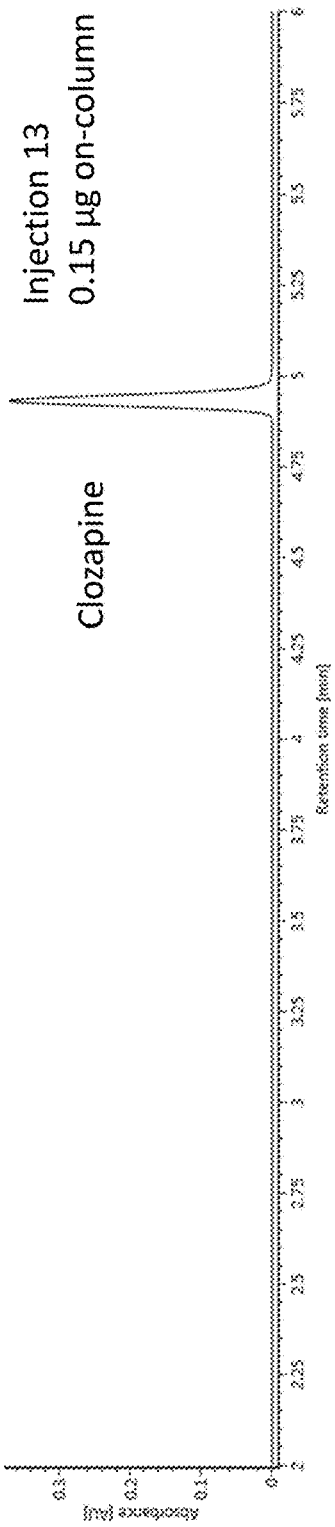

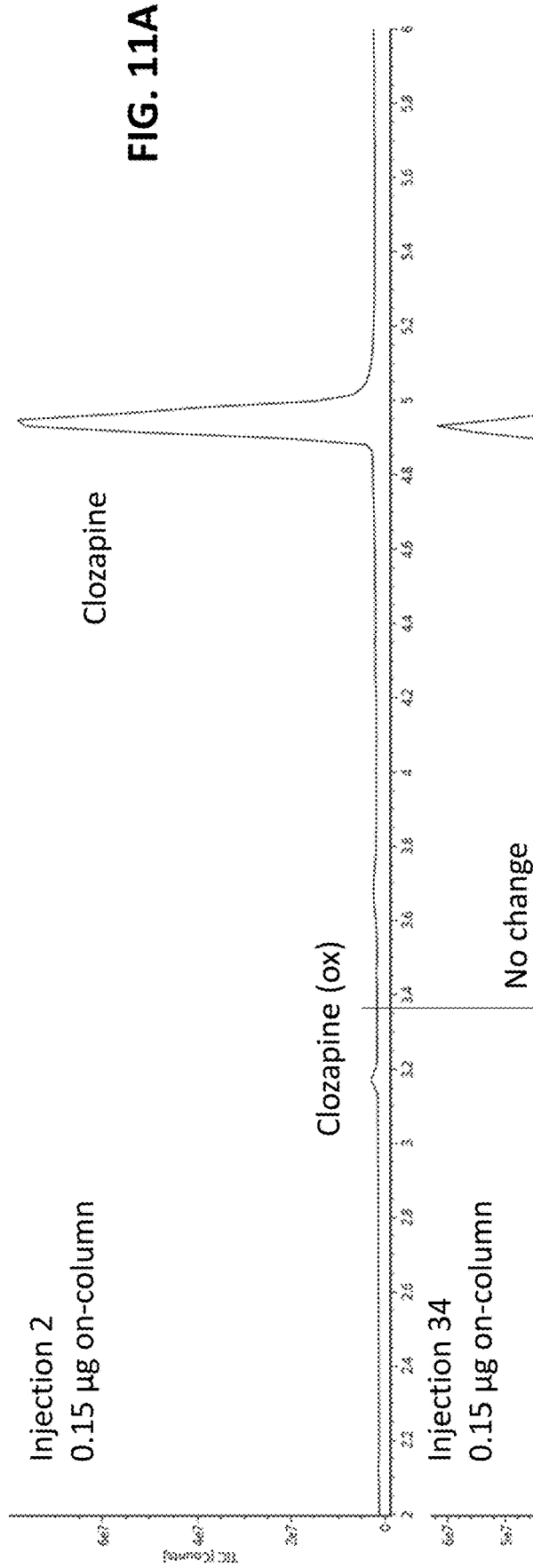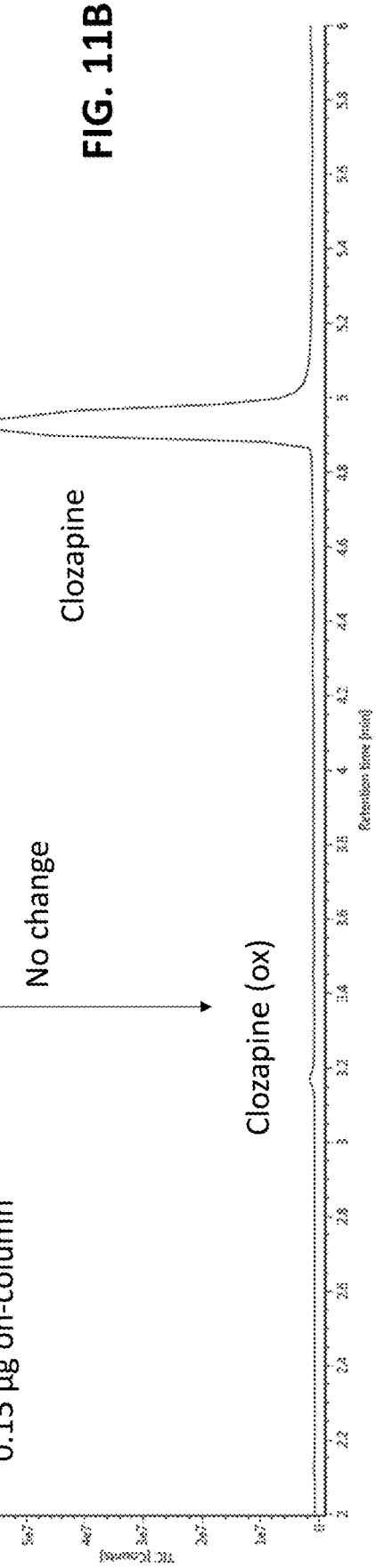
FIG. 11A
FIG. 11B

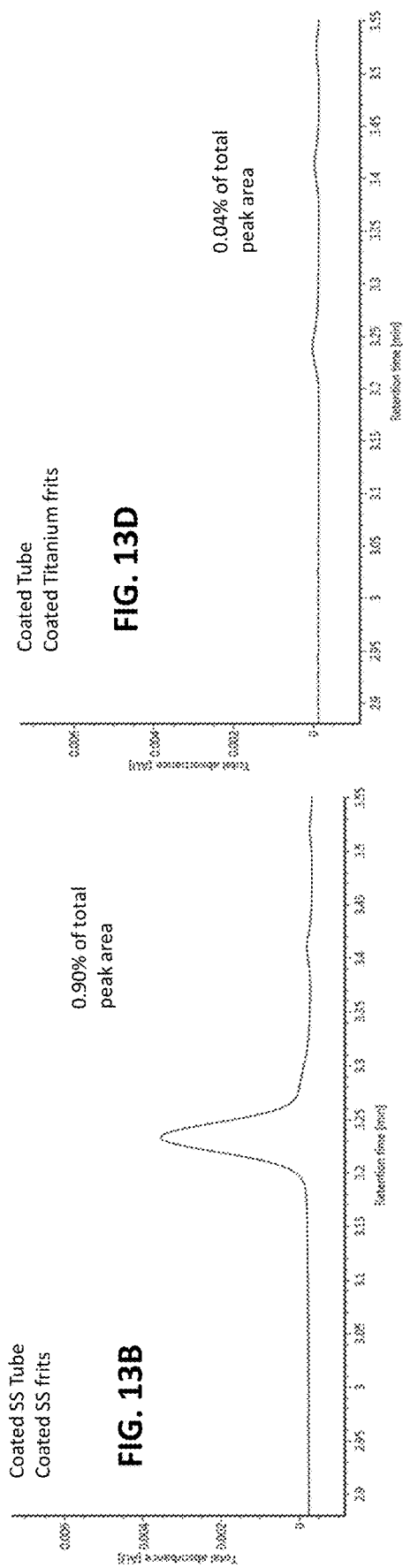
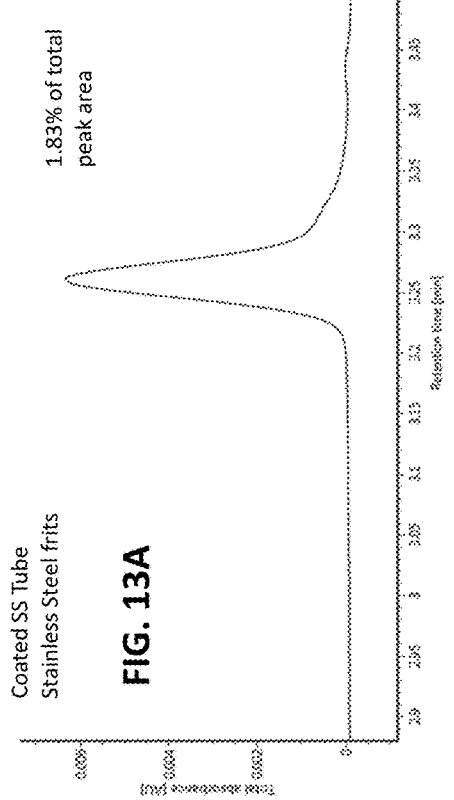
FIG. 13A — Coated SS Tube, Stainless Steel frits — 1.83% of total peak area
FIG. 13B — Coated SS Tube, Coated SS frits — 0.90% of total peak area
FIG. 13C — Coated SS Tube, Titanium frits — 0.21% of total peak area
FIG. 13D — Coated Tube, Coated Titanium frits — 0.04% of total peak area

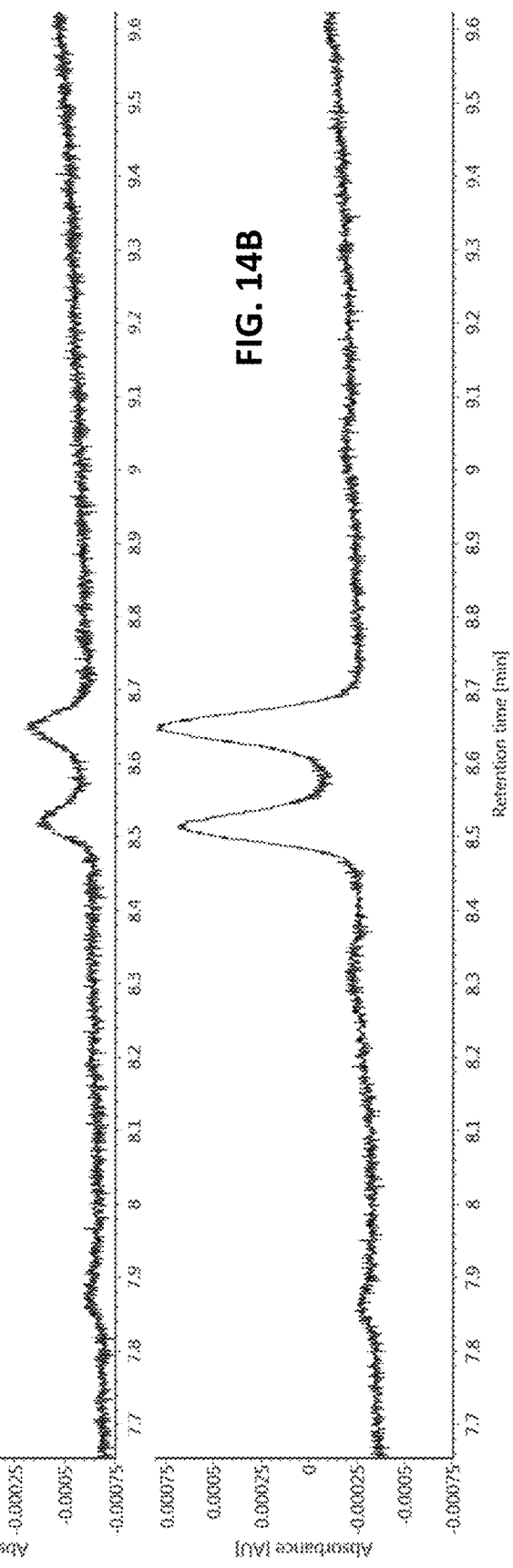
FIG. 14A
FIG. 14B

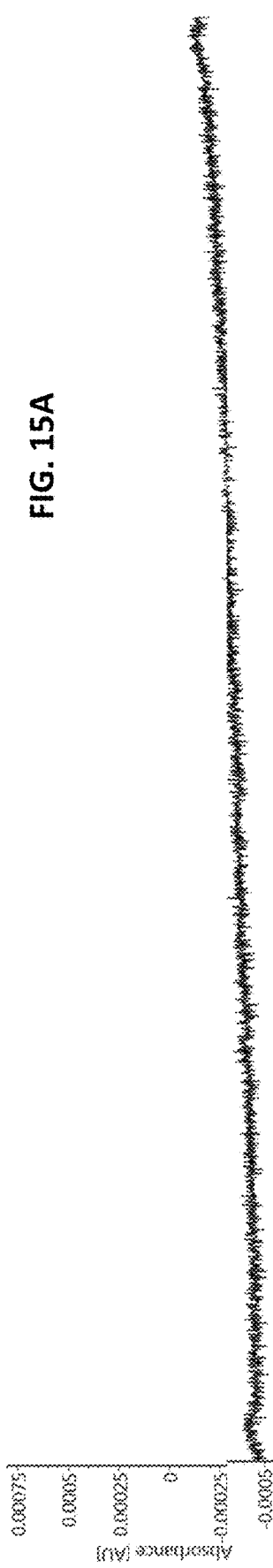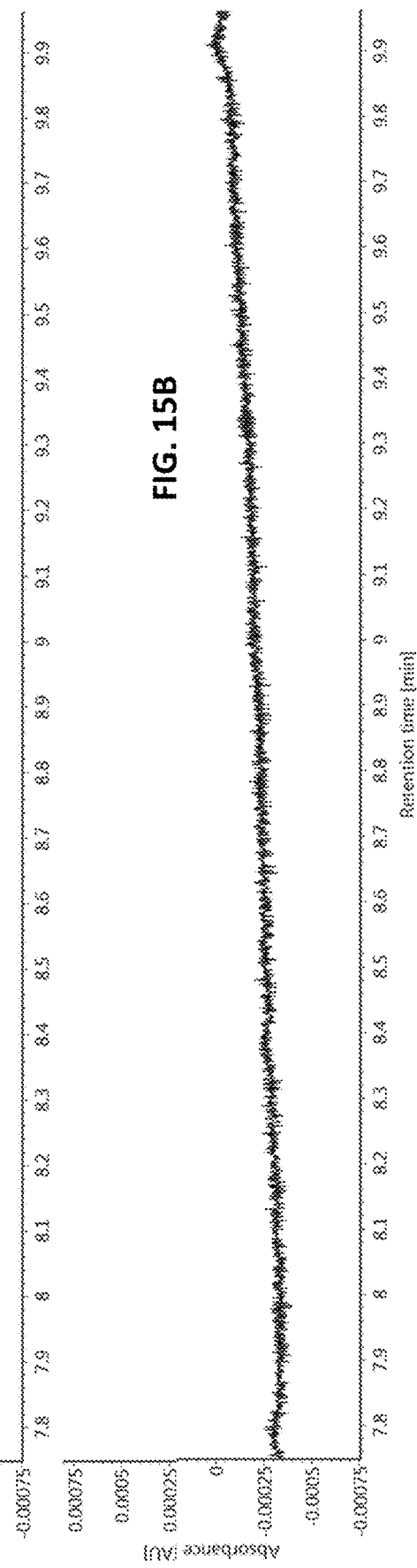
FIG. 15A
FIG. 15B

CHROMATOGRAPHIC HARDWARE IMPROVEMENTS FOR SEPARATION OF REACTIVE MOLECULES

CROSS-REFERENCE TO RELATED APPLICATIONS

This application claims priority and benefit to U.S. Provisional Patent Application No. 63/082,539, filed on Sep. 24, 2020, and entitled "Chromatographic Hardware Improvements for the Separation of Reactive Molecules", the content of which is incorporated herein by reference in its entirety.

FIELD OF THE TECHNOLOGY

The present disclosure relates to devices and techniques for improving separation of reactive molecules. More specifically, this technology relates to devices and techniques for reducing or eliminating on-column analyte degradation.

BACKGROUND

Analytes that interact with metal have often proven to be very challenging to separate. The desire to have high pressure capable chromatographic systems with minimal dispersion has required that flow paths decrease in diameter and be able to withstand increasingly high pressures at increasingly fast flow rates. As a result, the material of choice for chromatographic flow paths is often metallic in nature. This is despite the fact that characteristics of certain analytes, for example, biomolecules, proteins, glycans, peptides, oligonucleotides, pesticides, bisphosphonic acids, anionic metabolites, and zwitterions like amino acids and neurotransmitters, are known to have unfavorable interactions, so called chromatographic secondary interactions, with metallic surfaces.

The proposed mechanism for metal specific binding interactions requires an understanding of the Lewis theory of acid-base chemistry. Pure metals and metal alloys (along with their corresponding oxide layers) have terminal metal atoms that have characteristics of a Lewis acid. More simply, these metal atoms show a propensity to accept donor electrons. This propensity is even more pronounced with any surface metal ions bearing a positive charge. Analytes with sufficient Lewis base characteristics (any substance that can donate non-bonding electrons) can potentially adsorb to these sites and thus form problematic non-covalent complexes. It is these substances that are defined as metal-interacting analytes.

For example, analytes having phosphate groups are excellent polydentate ligands capable of high affinity metal chelation. This interaction causes phosphorylated species to bind to the flow path metals thus reducing the detected amounts of such species, a particularly troublesome effect given that phosphorylated species are frequently the most important analytes of an assay.

Other characteristics of analytes can likewise pose problems. For example, carboxylate groups also have the ability to chelate to metals, albeit with lower affinities than phosphate groups. Yet, carboxylate functional groups are ubiquitous in, for example, biomolecules, giving the opportunity for cumulative polydentate-based adsorptive losses. These complications can exist not only on peptides and proteins, but also glycans. For example, N-glycan species can at times contain one or more phosphate groups as well as one or more carboxylate containing sialic acid residues. Additionally, smaller biomolecules such as nucleotides and saccharides, like sugar phosphates, can exhibit similar behavior to the previously mentioned N-glycan molecules. Moreover, chromatographic secondary interactions can be especially problematic with biomolecules, particularly larger structures, because they have a capacity (via their size and structural order) to form microenvironments that can adversely interact with separation components and flow path surfaces. In this case, a biomolecule or analyte having larger structures, can present structural regions with chemical properties that amplify a secondary interaction to the material within the flow path. This, combined with the cumulative metal chelation effects curtails the overall effective separation of biomolecules, pesticides, bisphosphonic acids, anionic metabolites, and zwitterions like amino acids and neurotransmitters.

Reactive metal species can cause other problems in addition to adsorption on metal surfaces. That is, unwanted metal species can catalyze reactions throughout the liquid chromatography system, resulting in on-column degradation. For example, on-column degradation can result from dissolved metal ions in solution (either a single metal, metal-oxide or cluster-molecule species) absorbing on the surfaces of frits or the stationary phase. Unwanted, reactive metal species can also emerge from small insoluble metal or metal oxide particulates reacting with metal surfaces, such as frits, tubing, etc. or from metal precipitates collecting on the head of a column.

It is common for separation systems to include stainless steel not only as conduits or column bodies, but also as hardware within the flow path, such as frits. The use of stainless-steel hardware can result in on-column analyte degradation due to interactions with the exposed metal surfaces, such as, for example, the tubing, column body, and frits. As frits are housed completely within the columns, they contribute to the on-column reactions and lead to undesired adsorption of analytes.

To address these issues, metals, such as titanium and titanium alloys, which are less problematic then stainless steel have been used to form frits. However, these less problematic materials can still lead to undesired adsorption of analytes and contribute to on-column reactions. Adsorptive losses to the labware, such as frits, decreases the strength of analytical results.

Ongoing efforts to reduce interaction between wetted surfaces and fluidic samples to provide improved outcomes are therefore needed.

SUMMARY

In general, the present technology relates to a surface coating applied to metal frit to address on-column analyte degradation. The present technology also features applying the surface coating to other metallic components of a liquid chromatography system (e.g., frit, tubing, connectors, sample reservoir and injector, and/or column) to address analyte degradation in a liquid chromatography system. In some embodiments, the surface coating is an inorganic-organic hybrid coating that can be vapor deposited to cover exterior surfaces of metal frits, such as stainless steel frits and non-stainless steel frits (e.g., titanium). Using this technology, active sites on the metal surfaces of the frits can be masked to prevent on-column metal catalyzed analyte reactions such as, for example, oxidation, amination, nitrosylation or nitrosation. The application of the surface coating (e.g., inorganic-organic hybrid surface) to metal frits provides a reduction in on-column degradation versus non-coated counterparts. In general, the application of the surface coating eliminates or reduces the number of metallic surface sites available for reaction with the analyte.

In one aspect, the present technology is directed to a chromatography column. The chromatography column includes a frit comprising a metal substrate and an outer coating surrounding at least a portion of a surface of the substrate, wherein the outer coating includes an inorganic-organic hybrid.

The above aspect can include one or more of the following features. In one embodiment, the metal substrate comprises substantially pure titanium. In certain embodiments the outer coating can include C2 and/or C2C10. In some embodiments, the frit can further include an intermediate coating disposed between at least a portion of the outer coating and the surface of the metal substrate. The intermediate coating can be a pure metal, a metal oxide, a metal nitride or a metal carbide. In some embodiments, at least a portion of exposed metal walls housed within the chromatography column comprise a fluid-containing coating including the inorganic-organic hybrid, such as for example, C2 and/or C2C10.

In one aspect, the present technology is directed to a method of reducing metal-catalyzed reactions (e.g., degradation) of sample components (e.g., amines) during liquid chromatography. The method includes separating a sample in a chromatography column including a masked metal frit, wherein the masked metal frit comprises a metal frit coated on exterior surfaces with an inorganic-organic hybrid coating that is non-reactive with the sample components; and detecting separated sample components with a detector. In certain embodiments the sample is separated using an inert LC chromatography system, which includes a column, and other hardware that has all or a substantial portion of its metallic wetted surface coated with an inert coating, such as, for example, the same inorganic-organic hybrid coating on the metal frit. In some embodiments the inert LC chromatography system also includes a bioinert pump to deliver solvents to the chromatography column.

The above aspect can include one or more of the following features. In one embodiment, the masked metal frit comprises a pure or substantially pure (e.g., 97% pure or greater) titanium frit, that is then coated on its exterior with the inorganic-organic hybrid coating. In an embodiment, the masked metal frit comprises a titanium alloy frit, that is then coated on its exterior with the inorganic-organic hybrid coating. The masked metal frit, i.e., including the inorganic-organic coating, reduces the number of sites for reaction with the sample or solvents within the system. In certain embodiments, the masked metal frit comprises a stainless steel frit, that is then coated on its exterior with the inorganic-organic hybrid coating. In certain embodiments, the frit includes an intermediate coating comprising a metal (e.g., titanium, titanium alloy, platinum, etc.), a metal oxide, a metal nitride, or a metal carbide layer applied prior to the inorganic-organic hybrid coating on the exterior. In some embodiments, the intermediate coating provides pore sealing and chemical stability characteristics to the underlying metal substrate. For example, some metal-oxides that seal pores and provide chemical stability include, but are not limited to, $Al_2O_3$, $TiO_2$, $Ta_2O_5$, and $ZrO_2$. In some embodiments the intermediate coating is applied simultaneously (e.g., at the same time, or within the same reaction chamber) with the inorganic-organic hybrid coating. In some embodiments, the metal containing coating comprises titanium (e.g., pure titanium, titanium alloy, titanium oxide). In some embodiments, the inorganic-organic hybrid coating is an organosilica coating. In some embodiments, the inorganic-organic hybrid coating is an alkylsily coating. In certain embodiment, in addition to including a masked metal frit, exposed metal walls within the chromatography column (or metallic surfaces within the LC system) are coated with the inorganic-organic hybrid coating. The inorganic-organic hybrid coating prevents or reduces catalytic reactions with the sample and/or with the solvents used in the LC system.

In one aspect, the present technology is directed to a method for improving chromatographic performance in the separation of a sample including amines. The method includes separating the sample in an inert liquid chromatography system comprising a column including a titanium frit coated with an inorganic-organic hybrid coating; and detecting the separated components using a UV detector or a MS detector. In some embodiments, the method further includes providing a bioinert pump (as part of the inert liquid chromatography system) to deliver solvents to the chromatography column. In certain embodiments of the method feature an inert liquid chromatography system that includes interior column surfaces having an inorganic-organic hybrid coating.

The above aspect can include one or more of the following features. In one embodiment, the titanium frit is coated with one or more layers of C2. In certain embodiments, the titanium frit is coated with a base layer of C2 and a top layer of C2C10. In embodiments, the titanium frit is coated with a diol encapped inorganic-organic hybrid coating. In other embodiments, the titanium frit is coated with a phenyl encapped inorganic organic hybrid coating.

In another aspect, the present technology is directed to an inert frit for a liquid chromatography column. The inert frit includes a stainless steel substrate including a multi-layer coating. The multi-layer coating includes a titanium layer adjacent to the stainless steel substrate and an outer layer. The outer layer includes an inorganic-organic hybrid coating. In another aspect, the present technology is directed to an inert frit comprising a substantially pure titanium substrate (e.g., less than 5% impurities, less than 3% impurities, less than 1% impurities) with a vapor deposited C2 coating and/or C2C10 covering all exterior surfaces to prevent analyte-metal interactions in the liquid chromatography column. In still yet another aspect, the present technology is directed to an inert frit for a liquid chromatography column. The inert frit comprising a substantially pure titanium substrate with a vapor deposited C2C10 coating covering all exterior surfaces to prevent analyte-metal interactions in the liquid chromatography column.

The above aspects and features of the present technology provide numerous advantages. For example, the devices and methods of the present disclosure reduce the deleterious outcomes of utilizing a metal based frit within a liquid chromatography system. Using the present technology, active sites on the metal surfaces of stainless steel or other metals (e.g., titanium or titanium alloys) can be masked to prevent on-column metal catalyzed analyte interactions such as oxidation or nitrosation. In particular, the methods of the present technology allow for the application of an inorganic-organic hybrid surface to coat and thus mask an underlying metal frit or other hardware used within the liquid flow path to reduce on-column degradation, thereby increasing the strength of analytical results.

BRIEF DESCRIPTION OF THE DRAWINGS

The technology will be more fully understood from the following detailed description taken in conjunction with the accompanying drawings, in which:

FIG. 8A is a TIC chromatogram of Clozapine using a stainless steel column after two injections.

FIG. 8B is a TIC chromatogram of Clozapine using a stainless steel column after thirty-four injections.

FIG. 9A is a MS spectra showing the identification of Clozapine.

FIG. 9B is a MS spectra showing the identification of the n-oxide of Clozapine.

FIG. 10A is a UV chromatogram of Clozapine using a coated (i.e., C2 coated) stainless steel column having a coated (i.e., C2 coated) Ti frit after one injection.

FIG. 10B is a UV chromatogram of Clozapine using a coated (i.e., C2 coated) stainless steel column having a coated (i.e., C2 coated) Ti frit after two injections.

FIG. 10C is a UV chromatogram of Clozapine using a coated (i.e., C2 coated) stainless steel column having a coated (i.e., C2 coated) Ti frit after thirteen injections.

FIG. 11A is a TIC chromatogram of Clozapine using a coated (i.e. C2 coated) stainless steel column having a coated (i.e., C2 coated) Ti frit after two injections.

FIG. 11B is a TIC chromatogram of Clozapine using a coated (i.e., C2 coated) stainless steel column having a coated (i.e., C2 coated) Ti frit after thirty-four injections.

FIG. 13A is a TIC chromatogram of a Clozapine separation using a C2 coated stainless steel column with uncoated stainless steel frits. The TIC chromatogram is focused on the n-oxide peak after the fifth injection.

FIG. 13B is a TIC chromatogram of a Clozapine separation using a C2 coated stainless steel column with C2 coated stainless steel frits. The TIC chromatogram is focused on the n-oxide peak after the fifth injection.

FIG. 13C is a TIC chromatogram of a Clozapine separation using a C2 coated stainless steel column with uncoated titanium frits. The TIC chromatogram is focused on the n-oxide peak after the fifth injection.

FIG. 13D is a TIC chromatogram of a Clozapine separation using a C2 coated stainless steel column with C2 coated titanium frits. The TIC chromatogram is focused on the n-oxide peak after the fifth injection.

FIG. 14A is a TIC chromatogram of a Clozapine separation using a stainless steel column with uncoated stainless steel frits. The TIC chromatogram is focused on the z and e isomers of the Clozapine nitroso impurity peaks after the second injection.

FIG. 14B is a TIC chromatogram of a Clozapine separation using a stainless steel column with uncoated stainless steel frits. The TIC chromatogram is focused on the z and e isomers of the Clozapine nitroso impurity peaks after the thirty-fourth injection.

FIG. 15A is a TIC chromatogram of a Clozapine separation using a C2 coated stainless steel column with C2 coated Ti frits. The TIC chromatogram is focused on the location of z and e isomers of the Clozapine nitroso impurity peaks after the second injection.

FIG. 15B is a TIC chromatogram of a Clozapine separation using a C2 coated stainless steel column with C2 coated Ti frits. The TIC chromatogram is focused on the location of z and e isomers of the Clozapine nitroso impurity peaks after the thirty-fourth injection.

DETAILED DESCRIPTION

In general, the present disclosure is directed to devices and methods for creating an inert liquid chromatography (LC) system. Specifically, the present disclosure is directed to the application of an inorganic-organic hybrid coating applied to an underlying metal substrate to form a mask to reduce or prevent analyte-metal interactions in a LC system. In embodiments, the inorganic-organic hybrid coating is vapor deposited to create a uniform coating. In particular, the present technology relates to devices or systems including an inorganic-organic hybrid coating to mask a metal frit (e.g., a titanium frit, metal frit having a titanium layer) for use in an inert liquid chromatography system. In some instances, the present technology relates to methods of providing a coated frit to a system, and in particular a coated, inert LC system, to reduce on-column degradation, thereby increasing the strength of analytical results.

Various conditions are used in liquid chromatography (LC) to optimize the performance of analyte separations. In chromatography such as reversed-phase chromatography, an analyte is typically eluted with the use of an aqueous mobile phase and an organic solvent. Acetonitrile and methanol are common solvents used for elution but have been shown to corrode stainless steel and other metals over time. This corrosion can cause the metal surfaces of the LC system or column, particularly with regards to the frit, to become catalytically active. This can lead to analyte-metal interactions resulting in the degradation of the sample components.

Figure 1C:
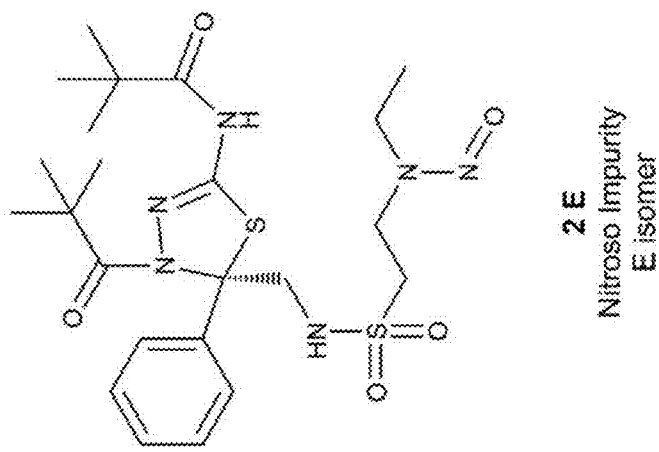
FIG. 1C is a schematic of the chemical formula of a nitroso impurity of Litronesib, (E isomer).
Figure 1B:
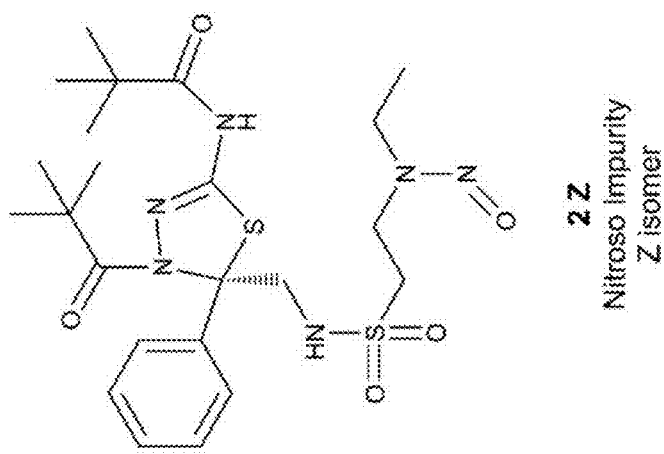
FIG. 1B is a schematic of the chemical formula of a nitroso impurity of Litronesib, (Z isomer).
Figure 1A:
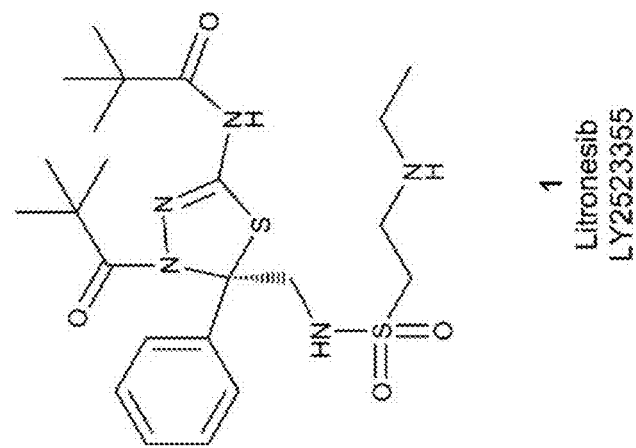
FIG. 1A is a schematic of the chemical formula of Litronesib, an amine.
Figures 1D, 1E:
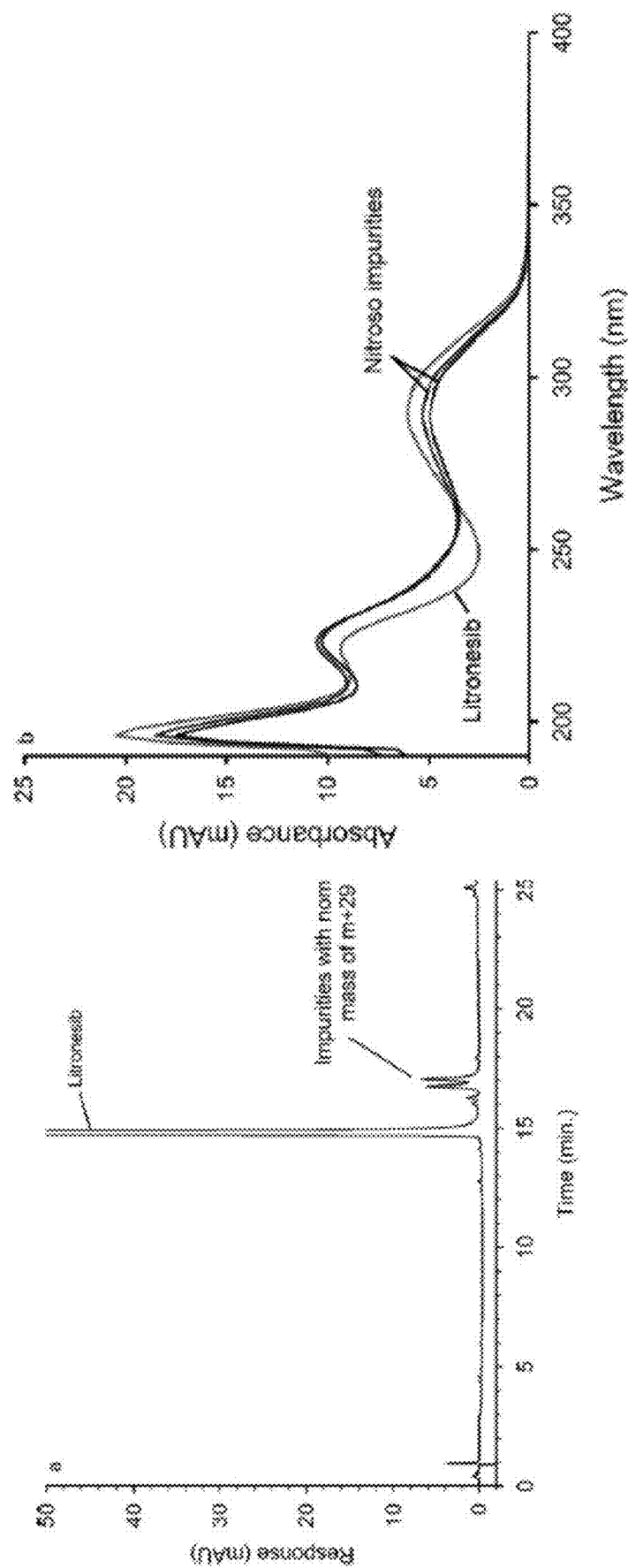
FIG. 1D is a chromatogram of a Litronesib separation in which the nitroso impurities are present due to nitrosation of Litronesib during separation.
FIG. 1E is a UV chromatogram of a Litronesib separation in which the nitroso impurities are present due to nitrosation of Litronesib during separation.

Two examples of metal catalyzed analyte reactions include nitrosation and oxidation. That is, metal active surfaces exposed to organic solvents provide active sites for reactions with certain analytes, such as amines. For example, Litronesib, a kinesin inhibitor, commonly studied as a potential treatment in cancer protocols, can be transformed in a metal catalyzed reaction by nitrosation to form impurities that degrade analytic separation results. Referring to FIG. 1A shown is the chemical formula of Litronesib. In a catalytically active environment, such as an environment with exposed metal, acetonitrile and/or methanol, the polar covalent bond NH at the bottom of the structure can react in a nitrosation reaction to form either the Z isomer (FIG. 1B) or the E isomer (FIG. 1C). As a result of the nitrosation reaction, some of the original sample material is transformed to a different form, which will change the analytical findings of an investigation. For example, FIG. 1D provides a chromatogram (from Myers, et al. *Journal of Chromatography A*, Volume 1319, 6 Dec. 2013, pages 57-64) of a separation of a known quantity of Libronesib. Due to the nitrosation of a portion of the analytes to an impurity form (Z isomer or E isomer) impurity peaks are present in the spectra, which degrade the quality of the result. Also see FIG. 1E providing the results from a UV detector from a Litronesib separation, which was degraded by nitrosation reactions.

Figure 2B:
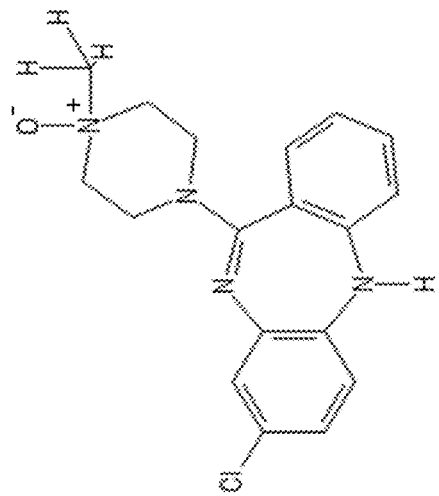
FIG. 2B is a schematic of the chemical formula of a n-oxide of Clozapine.
Figure 2A:
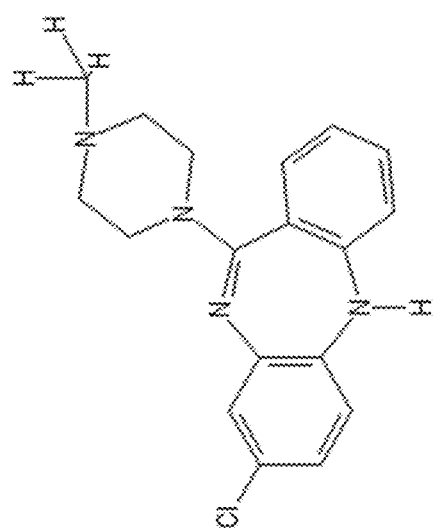
FIG. 2A is a schematic of the chemical formula of Clozapine, an amine.

Oxidation catalytic reactions are also possible during chromatographic separations including metal within the flow path. For example, Clozapine, an amine and antipsychotic drug, is known to react in a separation environment having exposed metal and organic solvents. During a separation, at least a portion of Clozapine within a sample, due to the active metal sites and the organic solvents can be transformed to an n-oxide. FIGS. 2A-2B illustrate the chemical formula of Clozapine and its n-oxide.

Other analytes, besides amines, are susceptible to on-column degradation. For example, anilines have been known to degrade in a dimerization process when exposed to metal LC components in the presence of ammonium hydroxide and acetonitrile. And various additives (e.g., flavor, food additives) such as, for example, baicalin, baicalein, and propyl gallate, are known to degrade by polyphenol oxidation in a metallic LC system with formic acid and acetonitrile used in the mobile phase.

To address these degradations, several alternative surfaces have been proposed over the years including the use of titanium or titanium alloys instead of stainless steel. Titanium and its alloys is known to be less reactive than stainless steel in organic solvents. However, titanium has been shown to still be chromatographically reactive and can contribute to the adsorption of analytes. Additionally, it has been found that titanium surfaces can leach ions when used with methanol, a common LC solvent. In this way, metal-catalyzed reactions from the column, its components (e.g., frits) or LC system can still occur.

In the present technology, an application of an inorganic-organic hybrid vapor deposited coating (e.g., alkylsilyl coating, a diol coating, a phenyl coating, other ligand based coating) to stainless steel or other metal material can prevent the occurrence of degradation as caused by the column or LC system. The inorganic-organic hybrid coating can mask the metal surfaces of the column and LC system from corrosion as caused by mobile phases such as acetonitrile and methanol or even the analyte itself. The inorganic-organic hybrid coating prevents corrosion of the underlying metal and thus analyte degradation if the active sites on the metal surfaces are masked. By utilizing vapor deposition, a uniform coating on a frit masking the active site while still allowing for passage therethrough can be achieved. Reduction in degradation is realized on many different metal substrates, not just titanium and its alloys, but also stainless steel.

The present technology includes, in some embodiments, multiple layers or coatings to mask the active sites. For example, in certain embodiments, a multilayer inorganic-organic hybrid coating is applied on top of the metal frit. The multilayer coating may be a single material (e.g., C2 or C2C10) in which a base layer is applied first and then is built up in a second layer. Alternatively, the multilayer coating can comprise two different materials. For example, a base layer of C2 is vapor deposited directly onto a titanium frit followed by a growth layer or secondary layer comprising C2C10. In certain embodiments, the frit can be preprocesses prior to application of an inorganic-organic hybrid coating. For example, a stainless steel frit can be metalized with a different metal material to reduce active sites prior to the application of the inorganic-organic hybrid coating. For example, a single metal material, such as Ti can be applied as a base coating material. In other embodiments, an alloy can be applied to the frit prior to the inorganic-organic hybrid coating. In certain embodiments, a metal-oxide, metal-nitride, or in some cases, a metal-carbide base coating is applied to a stainless steel frit. In one embodiment, a titanium coating is applied (e.g., painted or vapor deposited onto) the metal frit as a base layer; next the inorganic-organic hybrid coating (e.g., C2) is vapor deposited over the Ti metalized stainless steel frit. In another embodiment, a double bilayer consisting of alumina and titania, or alumina and tantalum oxide is applied via vapor deposition to the stainless steel frit (or other component) substrate followed by the vapor application of the inorganic-organic hybrid coating on the exterior.

In some aspects, the present technology is directed to the use of a masked frit within an inert LC system. In embodiments, the present technology includes methods and systems comprising the use of a masked metal frit (e.g., inorganic-organic hybrid coated metal frit) in a LC system that has been tailored to reduce secondary interactions. For example, the present technology includes using a C2 coated titanium frit in a LC system that includes a coating along its wetted flow path. In some embodiments, the wetted flow path includes the column and connected tubing. In certain embodiments, the wetted flow path extends from the sample reservoir, through the sample injector, to connective tubing, column, and to one or more detectors downstream of the tubing. An example of one such system includes the systems described in US Patent Publication US 2020-0215457 (Jul. 9, 2020), herein incorporated by reference. In certain embodiments, the LC system also includes a specialized pump have bioinert surfaces. Examples of commercially available pumps with biocompatible pumps include, but are not limited to, bioQSM (part number 18601541), bioQSM PLUS (part number 18601581), bioQSM-XR PLUS (part number 18601584), and bioBSM (part number 18601561) all available from Waters Technologies Corporation (Milford, MA).

Figure 3:
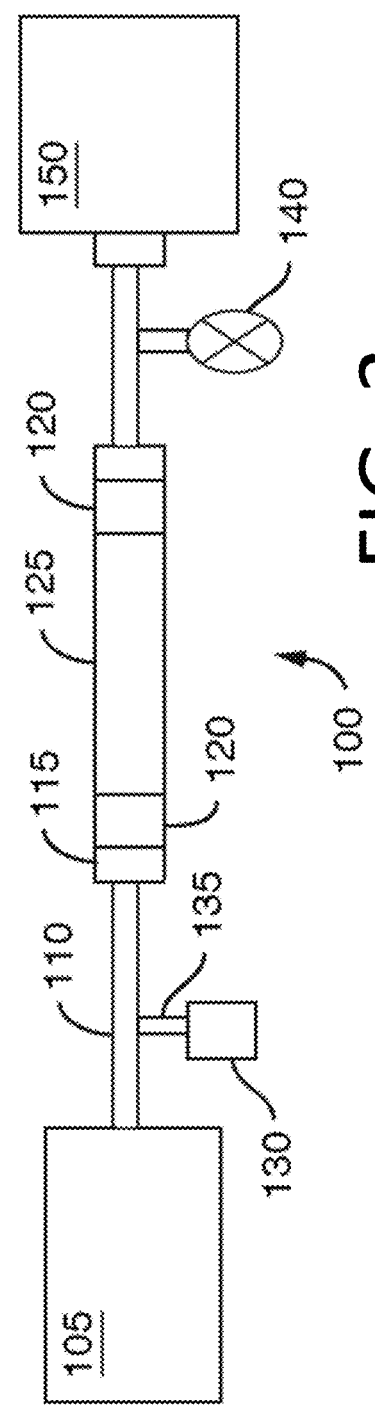
FIG. 3 is a schematic of a chromatographic flow system including a chromatography column and various other components, in accordance with an illustrative embodiment of the technology. A fluid is carried through the chromatographic flow system with a fluidic flow path extending from a fluid manager to a detector, such as a MS detector.

The present technology is also related to methods to reducing degradation of sample components during liquid chromatography. In general, the method aims to mask metal within the flow path to reduce possible metal-catalyzed reactions, such as nitrosation and oxidation of sample components. FIG. 3 is a representative schematic of a chromatographic flow system/device 100 that can be used to separate analytes, such as amines, in a sample. The sample may contain other analytes known to be susceptible to degradation. For example, in some embodiments, the sample can include anilines, or additives, such as baicalin, baicalein, propyl gallate, quercetin-e-rhamnoside, or rutin. Chromatographic flow system 100 includes several components including a fluid manager system 105 (e.g., controls mobile phase flow through the system), tubing 110 (which could also be replaced or used together with micro fabricated fluid conduits), fluid connectors 115 (e.g., fluidic caps), frits 120, a chromatography column 125 (which houses a frit 120 at its entrance and/or exit), a sample injector 135 including a needle (not shown) to insert or inject the sample into the mobile phase, a vial, sinker, or sample reservoir 130 for holding the sample prior to injection, a detector 150, such as a mass spectrometer, and a pressure regulator 140 for controlling pressure of the flow. Interior surfaces of the components of the chromatographic system/device form a fluidic flow path that has wetted surfaces. The fluidic flow path can have a length to diameter ratio of at least 20, at least 25, at least 30, at least 35 or at least 40. A pump for delivering fluids is part of the fluid manager 105 and the pump is not shown separately.

In the present technology, the frits 120 are positioned within the fluid flow path and has wetted surfaces. That is, the frits 120 are exposed to the organic solvents and sample passing therethrough. In general, metal frits are preferred for several reasons. For example, metal frits can be formed and shaped according to a desired need. Metal frits have well-understood permeability and particle retention capability. In addition, metal frits maintain their shape and structure even after extended periods of use. Metal frits do however contribute to analyte losses by providing active sites for metal-catalytic reactions. To reduce or prevent those reactions, but to maintain the structural integrity provided by metal frits, methods in accordance with the present disclosure separate samples with masked or coated metal frits to prevent analyte-metal interactions in the liquid chromatography column 125.

Figure 4:
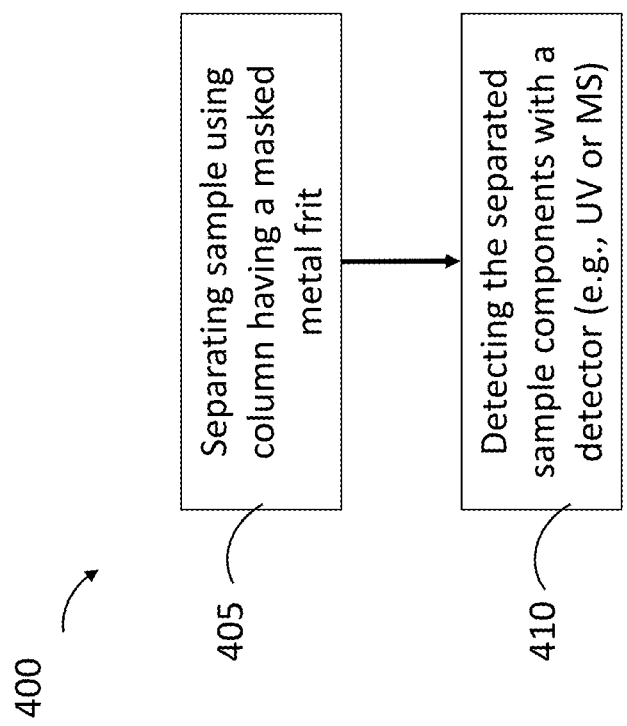
FIG. 4 is a flow chart showing a method of reducing degradation of sample components during liquid chromatography in accordance with an embodiment of the present technology.

FIG. 4 provides a flow chart illustrating a method of the present technology. The method 400 of reducing degradation of sample components during analysis (e.g., a liquid chromatographic separation) includes step 405 separating a sample using a column having a masked metal frit; and step 410 detecting the separated sample components with a detector. The masked metal frit of step 405 is a metal frit coated on exterior surfaces with a vapor deposited inorganic-organic hybrid coating. The coating on the masked or coated metal frit forms a barrier to prevent interaction between the underlying metal and the organic solvents/sample flowing through and about the frit. That is, the coating prevents analyte-metal interactions and thus reduces degradation of the sample components during liquid chromatography.

Some embodiments of the method, further include separating the sample in an inert liquid chromatography system that not only includes masked metal frits, but also coated wetted surfaces, and components (e.g., sample injectors and tubing connecting column to other components) and in some instances a bioinert pump for delivery of fluids.

Figure 5:
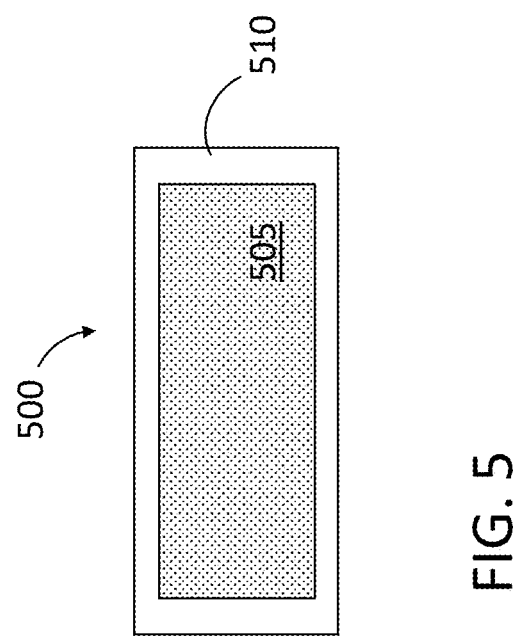
FIG. 5 is a cross-sectional view schematic of an embodiment of a frit in accordance with the present technology.

The masked frit 500 shown in FIG. 5 includes a metal substrate 505 which provides the structure and integrity to the frit and at least one coating layer 510. The at least one coating layer 510 is typically vapor deposited, such that the entire exterior of the masked frit 500 is protected by the coating—such that there are no active metal sites available for solvent/analyte interaction.

The inorganic-organic hybrid coatings protect the underlying metal material from interaction with organic solvents/metal reactive analytes. In one embodiment, the inorganic-organic hybrid coating is an alkylsilyl coating. The alkylsilyl coating is inert to at least one of the analytes in the sample. In some embodiments, the alkylsilyl coating is a organosilica coating. In certain embodiments, the alkylsilyl coating is an inorganic-organic hybrid material that forms the wetted surface or that coats the wetted surfaces (e.g., almost the entirety of the wetted surface, more than 95% of exposed surface, more than 97% of exposed surface, more than 99% of the exposed surface).

The inorganic-organic coating can have a contact angle of at least about 15°. In some embodiments, the coating can have a contact angle of less than or equal to 30°. The contact angle can be less than or equal to about 115°. In some embodiments, the contact angle of the coating is between about 15° to about 90°, in some embodiments about 15° to about 105°, and in some embodiments about 15° to about 115°. For example, the contact angle of the coating can be about 0°, 5°, 10°, 15°, 20°, 25°, 30°, 35°, 40°, 45°, 50°, 55°, 60°, 65°, 70°, 75°, 80°, 85°, 90°, 95°, 100°, 105°, 110°, or 115°.

The thickness of the inorganic-organic hybrid coating, e.g., the alkylsilyl coating, can be at least about 100 Å. For example, the thickness can be between about 100 Å to about 1600 Å. The thickness of the coating can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å. The thickness of the coating (e.g., a vapor deposited alkylsilyl coating) can be detected optically by the naked eye. For example, more opaqueness and coloration is indicative of a thicker coating. From thin to thick, the color changes from yellow, to violet, to blue, to slightly greenish and then back to yellow when coated parts are observed under full-spectrum light, such as sunlight. For example, when the alkylsilyl coating is 300 Å thick, the coating can appear yellow and reflect light with a peak wavelength between 560 and 590 nm. When the alkylsilyl coating is 600 Å thick, the coating can appear violet and reflect light with a peak wavelength between 400 and 450 nm. When the alkylsilyl coating is 1000 Å thick, the coating can appear blue and reflect light with a peak wavelength between 450 and 490 nm. See, e.g., Faucheu et al., *Relating Gloss Loss to Topographical Features of a PVDF Coating*, Published Oct. 6, 2004; Bohlin, Erik, *Surface and Porous Structure of Pigment Coatings, Interactions with flexographic ink and effects of print quality*, Dissertation, Karlstad University Studies, 2013:49.

The inorganic-organic hybrid coating can be the product of vapor deposited bis(trichlorosilyl)ethane, bis(trimethoxysilyl)ethane, bis(trichlorosilyl)octane, bis(trimethoxysilyl)octane, bis(trimethoxysilyl)hexane, and bis(trichlorosilyl)hexane.

In some aspects, at least a portion of the wetted surfaces are coated with multiple layers of the same or different alkylsilyls, where the thickness of the alkylsilyl coatings correlate with the number of layering steps performed (e.g., the number of deposited layers of alkylsilyl coating on wetted surfaces of the frits (or in the case of an inert LC system along wetted surfaces such as column walls, fittings, injectors, etc).

The metal frits can have multiple coatings, such as multiple alkylsilyl coatings. For example, a second alkylsilyl coating can be in direct contact with a first or base alkylsilyl coating. In one embodiment, a titanium metal frit is coated with a base coating of C2 and a second coating of C2C10.

In one aspect, the inorganic-organic hybrid coating is n-decyltrichlorosilane, (3-glycidyloxypropyl)trimethoxysilane (GPTMS), (3-glycidyloxypropyl)trimethoxysilane (GPTMS) followed by hydrolysis, 2-(3,4-epoxycyclohexyl)ethyltrimethoxysilane, trimethylchlorosilane, trimethyldimethyaminosilane, methoxy-polyethyleneoxy(3)silane propyltrichlorosilane, propyltrimethoxysilane, (heptadecafluoro-1,1,2,2-tetrahydrodecyl)tris(dimethylamino)silane, (heptadecafluoro-1,1,2,2-tetrahydrodecyl)trischlorosilane, (heptadecafluoro-1,1,2,2-tetrahydrodecyl)trimethoxysilane vinyltrichlorosilane, vinyltrimethoxysilane, allyltrichlorosilane, 2-[methoxy(polyethyleneoxy)3propyl]trichlorosilane, 2-[methoxy(polyethyleneoxy)3propyl]trimethoxysilane, or 2-[methoxy(polyethyleneoxy)3propyl]tris(dimethylamino)silane.

Other coating materials are possible besides alkylsilyl coatings. For example, other inorganic-organic hybrid coatings including diol, phenyl, or other ligands are available for use to protect the metal frit from undesired interactions.

In addition to applying an inorganic-organic hybrid coating to the metal frit, other processing can be used to reduce the undesired degradation of sample components. For example, if a stainless steel frit is desired due to its structural integrity, a metal containing exterior coating of titanium can be applied to its exterior surface either prior to or simultaneously with the vapor deposition of the inorganic-organic hybrid coating. Other types of metallization or metal containing coatings (prior to the deposition of the exterior inorganic-organic hybrid coating) of the stainless steel frit (or other metal LC component) are also possible. Instead of metallizing with titanium, the stainless steel frit could be first coated with iron, silicon, manganese, nickel, molybdenum, tin, cobalt, aluminum, copper, vanadium, chromium or boron. In certain embodiments, the metal frit can be coated with gold, platinum, silver, tungsten, tantalum, or iridium. In some embodiments, the stainless steel frit could first be coated or treated with carbon (e.g., diamond film), phosphorous, or sulfur prior to the exterior inorganic-organic hybrid being deposited to prevent analyte interactions.

Figure 6:
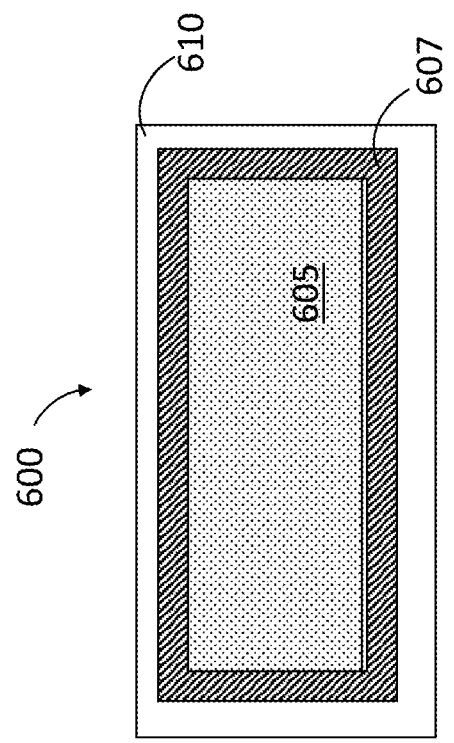
FIG. 6 is a cross-sectional view schematic of an embodiment of a frit in accordance with the present technology.

The masked frit can include multiple coating layers. For example, referring to FIG. 6, shown is a masked frit 600 including a metal containing layer 607 (e.g., layer containing a metal, alloy, metal-oxide, metal-nitride, or metal-carbide) covering the metal substrate 605, followed by one or more vapor deposited inorganic-organic hybrid coatings 610.

In some embodiments, the metal containing layer 607 is a single layer consisting of a single material (e.g., a Ti layer, a $Ti_2O_3$ layer, etc.). The metal containing layer 607 can also be a bilayer consisting of two different materials (e.g., layer of alumina followed by layer of titania). The metal containing layer 607 can comprise a pure or substantially pure elemental metal (e.g., Ti, Au, Pt). In other embodiments, the metal containing layer is an alloy, such as a Ti 6 Al-4V. In certain embodiments, the metal containing layer is an oxide, a nitride, or a carbide. For example, the metal containing layer can be alumina, silicon nitride, or titanium carbide. In embodiments, the metal containing layer is vapor deposited and in the case of an oxide, nitride, or carbide, the vapor deposition utilizes oxygen, nitrogen or carbon precursors in addition to the metal precursors. Table 1 provides a list of ligand types of interest which form the precursors used in the formation of the metal containing layer. Table 2 provides the precursors for forming oxides, nitrides, and carbides. The precursors listed in table 2 can be provided in an unactivated or plasma activated state. In some embodiments, the carbon precursors provided in Table 2 can be used in conjunction with metal oxides and nitrides to add organic bridges to these films.

TABLE 1

| Ligand types of interest which form the precursor used for deposition | |
|---|---|
| Metal | Ligand Types |
| Scandium | Cyclopentadienyl, amide, imide, amidinate |
| Yttrium | Cyclopentadienyl, amide, imide, amidinate |
| Titanium | halide, Cyclopentadienyl, alkoxide, amide, imide, amidinate |
| Zirconium | halide, Cyclopentadienyl, alkoxide, amide, imide, amidinate |
| Hafnium | halide, Cyclopentadienyl, alkoxide, amide, imide, amidinate |
| Vanadium | halide, alkoxide, amide, imide, amidinate |
| Niobium | halide, alkoxide, amide, imide |
| Tantalum | halide, alkoxide, amide, imide |
| Chromium | halide, alkoxide, amide, imide |
| Molybdenum | halide, amide, imide |
| Tungsten | halide, amide, imide |
| Aluminum | halide, alkyl, alkoxide, amide, imide, amidinate |
| Boron | halide, alkyl, alkoxide |
| Silicon | halide, alkyl, alkoxide, amide |
| Germanium | halide, alkyl, alkoxide, amidinate |

TABLE 2

| Oxide, Nitride and Carbide Precursors | |
|---|---|
| Oxygen precursors | Water, hydrogen peroxide, oxygen, ozone, alcohols |
| Nitrogen precursors | Nitrogen, ammonia, hydrazine |
| Carbon precursors | Acetylene, formic acid, carbon (see ligands from Table 1), alcohols, acids, anhydrides |

The masked frits of the present technology provide a major advance over uncoated frits. In the Example section below, evaluations of different frit materials in combination with different LC systems illustrate the technology reduces on-column catalytic reactions, such as, for example, oxidation and nitrosation, to a great extent over non-coated hardware. As a result, more robust analysis with strengthen results are provided over the conventional routes of separation.

EXAMPLES

Example 1: On-Column Oxidation of Different Column Technologies

Clozapine was prepared in 0.1% (w/v) 20/80/0.08 (acetonitrile/water/acetic acid). Analyses of these samples were performed using a Waters ACQUITY UPLC I-Class LC system and the separation method outlined below. FIGS. 7A-7C and FIGS. 8A-8B present the on-column oxidation results of the separations on an uncoated stainless steel column (Column A) from multiple injections. FIGS. 10A-10C and FIGS. 11A-11B present the on-column oxidation results of the separations on a C2 coated stainless steel column utilizing a C2 coated Ti frit (Column B) from multiple injections. FIG. 9A presents a mass spectra of Clozapine having a m/z=327, whereas FIG. 9B presents a mass spectra of n-oxide Clozapine having a m/z=343.

TABLE 3

Separation details for Example 1

| Test Conditions | |
|---|---|
| Column A (Conventional) | Hybrid Silica C18, 130 angstroms, 1.7 μm packed within a stainless steel column 2.1 × 50 mm (with stainless steel frit) |
| Column B (Coated Column) | Hybrid Silica C18, 130 angstroms, 1.7 μm packed within a C2 coated stainless steel column 2.1 × 50 mm (with C2 coated titanium frit) |
| Sample | 6 mg/mL Clozapine in acetonitrile/water/acetic acid |
| Solvent Conditions | |
| Solvent Line A | 0.05% (w/v) ammonium hydroxide in water |
| Solvent Line B | Acetonitrile |
| Column Temperature | 30° C. |
| Injection Volume | 0.5 μL (first injection), 0.25 μL (successive injections) |
| Diluent | 20/80/0.8 (w/v) acetonitrile/water/acetic acid |
| UV Detection | 290 nm |
| MS Conditions | |
| Mode | ESI positive, sensitivity |
| Mass Range | 50-1500 m/z |
| Capillary | 3.5 kV |
| Sample Cone | 40 V |
| Source Offset | 80 V |
| Source Temperature | 100° C. |
| Desolvation Temperature | 250° C. |
| Desolvation Gas | 600 L/h |
| Quadrupole Option | Automatic |

Gradient Table:

| Time (min) | Flow Rate (mL/min) | % A | % B | Curve |
|---|---|---|---|---|
| Initial | 0.310 | 75.0 | 25.0 | Initial |
| 0.45 | 0.310 | 75.0 | 25.0 | 6 |
| 10.31 | 0.310 | 20.0 | 80.0 | 6 |
| 11.20 | 0.310 | 20.0 | 80.0 | 6 |
| 11.25 | 0.310 | 20.0 | 80.0 | 6 |
| 12.55 | 0.310 | 20.0 | 80.0 | 6 |
| 13.00 | 0.310 | 75.0 | 25.0 | 6 |
| 15.00 | 0.310 | 75.0 | 25.0 | 6 |

Figures 7A, 7B, 7C:
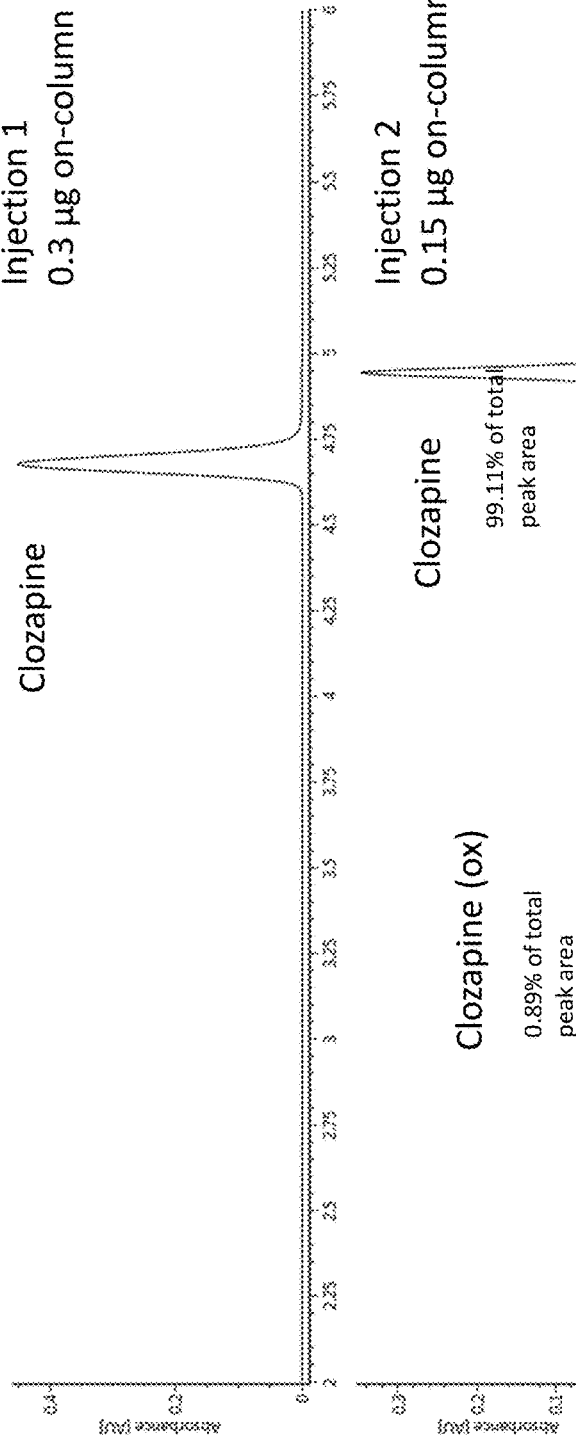
FIG. 7A is a UV chromatogram of Clozapine using a stainless steel column after one injection.
FIG. 7B is a UV chromatogram of Clozapine using a stainless steel column after two injections.
FIG. 7C is a UV chromatogram of Clozapine using a stainless steel column after thirteen injections.
Figure 12A:
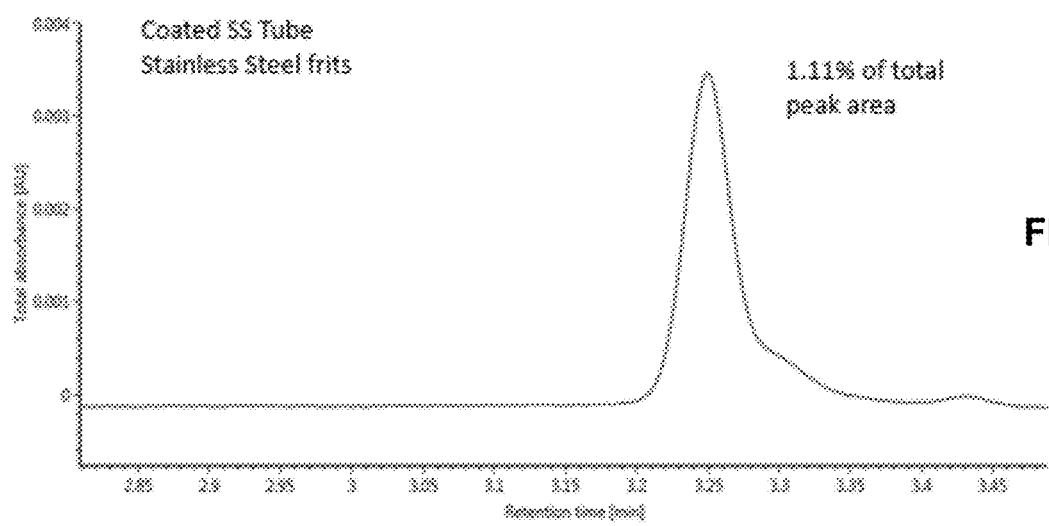
FIG. 12A is a TIC chromatogram of a Clozapine separation using a C2 coated stainless steel column with uncoated stainless steel frits. The TIC chromatogram is focused on the n-oxide peak after the second injection.
Figure 12B:
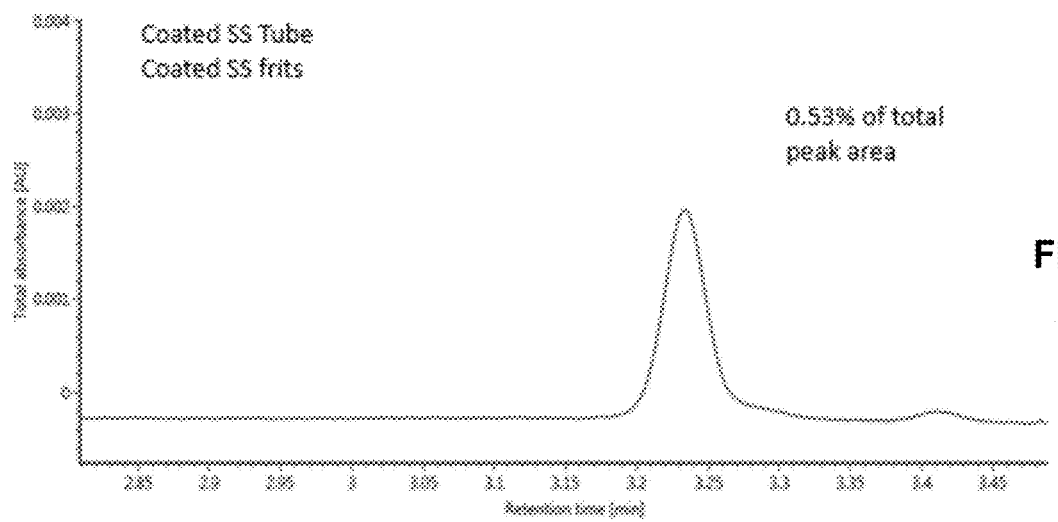
FIG. 12B is a TIC chromatogram of a Clozapine separation using a C2 coated stainless steel column with C2 coated stainless steel frits. The TIC chromatogram is focused on the n-oxide peak after the second injection.
Figure 12C:
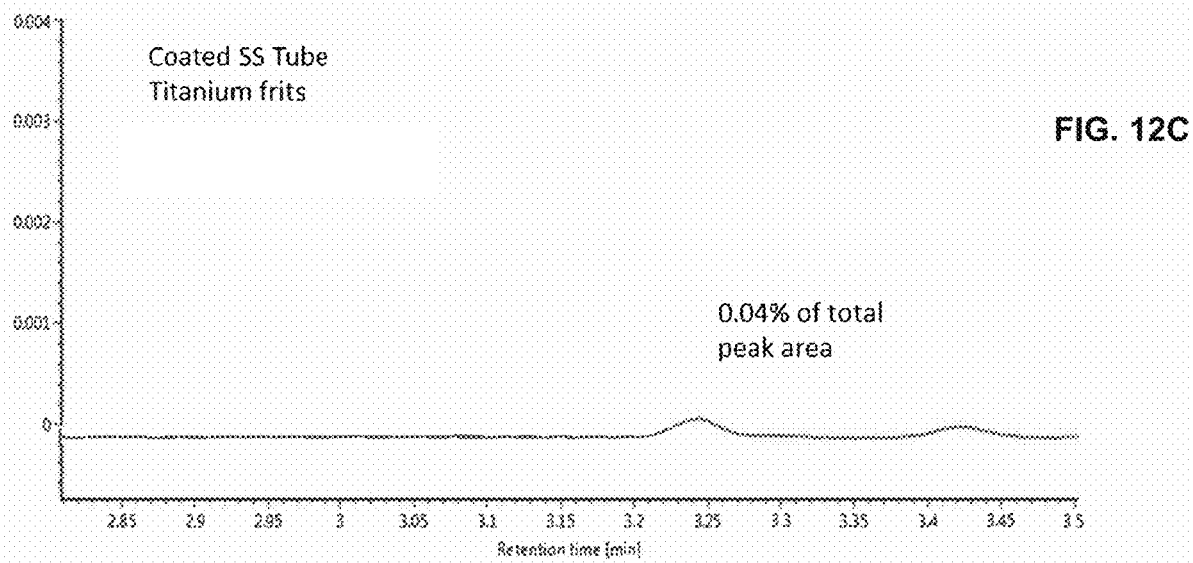
FIG. 12C is a TIC chromatogram of a Clozapine separation using a C2 coated stainless steel column with uncoated titanium frits. The TIC chromatogram is focused on the n-oxide peak after the second injection.
Figure 12D:
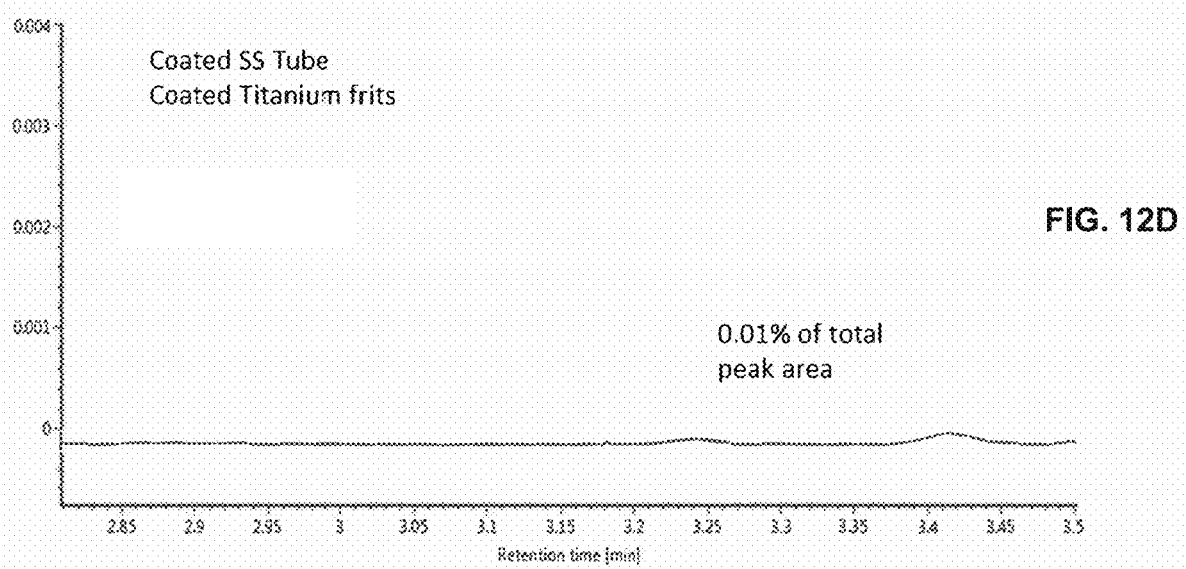
FIG. 12D is a TIC chromatogram of a Clozapine separation using a C2 coated stainless steel column with C2 coated titanium frits. The TIC chromatogram is focused on the n-oxide peak after the second injection.
Figure 12:
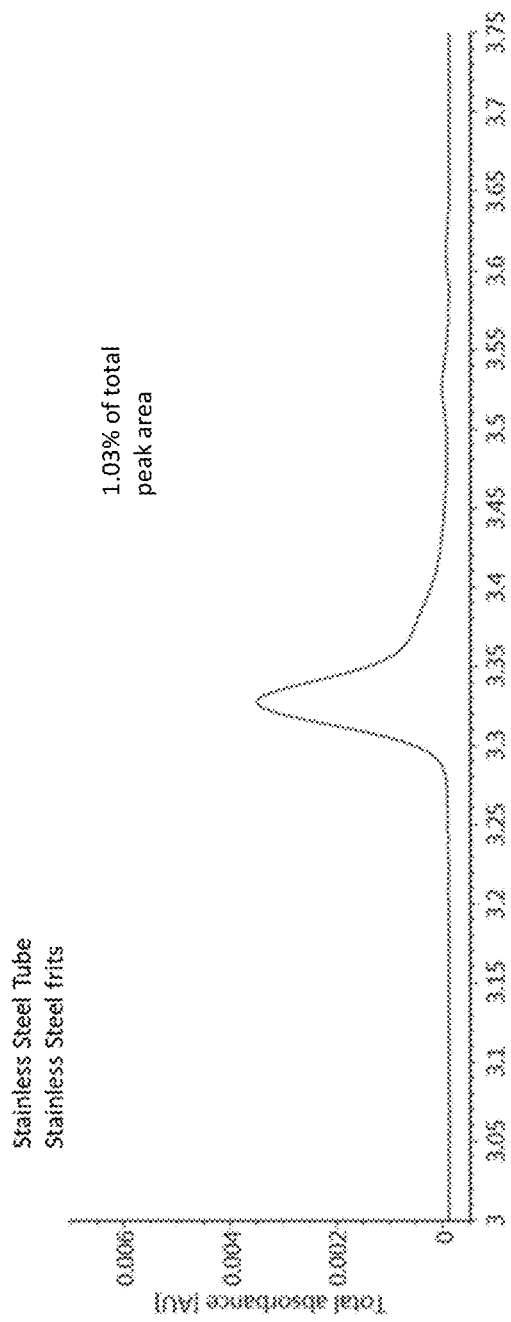
FIG. 12E is a TIC chromatogram of a Clozapine separation using a C2 uncoated stainless steel column with uncoated stainless steel frits. The TIC chromatogram is focused on the n-oxide peak after the second injection.
Figure 13E:
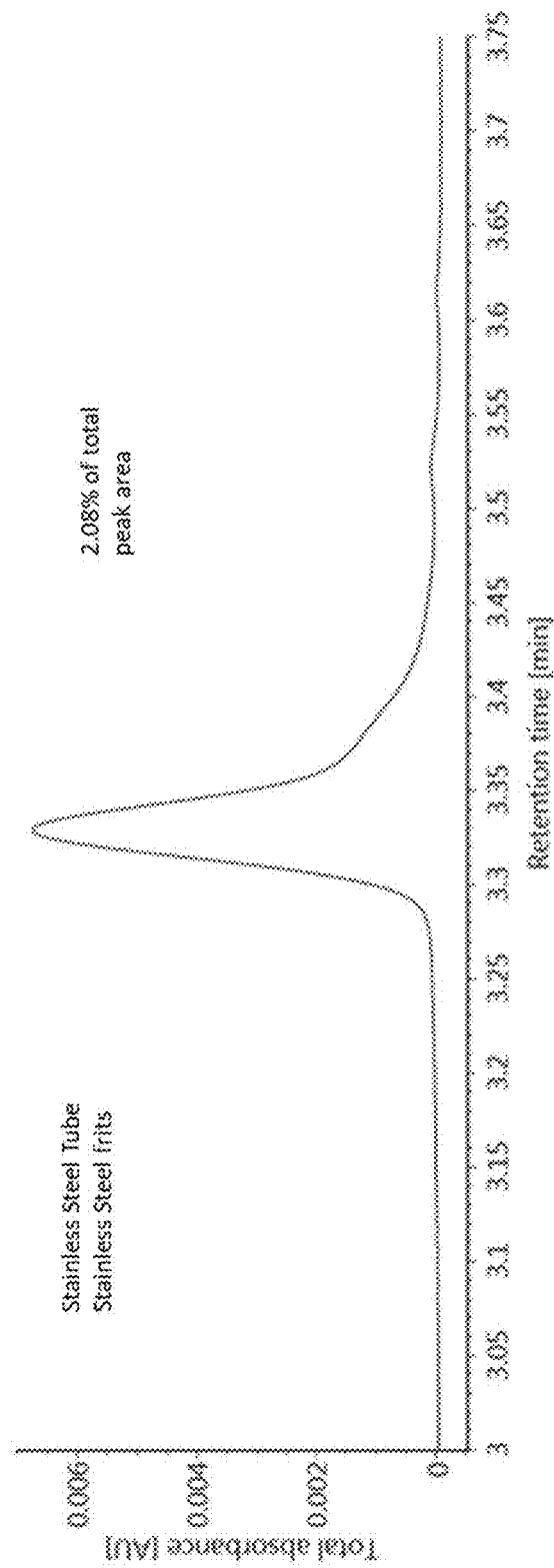
FIG. 13E is a TIC chromatogram of a Clozapine separation using an uncoated stainless steel column with uncoated stainless steel frits. The TIC chromatogram is focused on the n-oxide peak after the fifth injection.

The choice of column technology has an effect on metal-catalyzing reactions. In this example, two types of columns were investigated. Column A is an uncoated stainless steel column and Column B is a C2 coated stainless steel column. FIGS. 7A-7C illustrate the increasing effect of metal-catalyzing reaction for the separation of Clozapine on an uncoated column (Column A). In FIG. 7A after the first injection a clean Clozapine peak is observed. However, after more sample is provided to the system (2 injections shown in FIG. 7B and 13 in FIG. 7C), the oxide form of Clozapine appears, degrading the results. FIGS. 8A and 8B illustrate that the increase in the oxide form continues to increase and greatly effect results—compare oxide peak after two injections in FIG. 8A to the oxide peak after 34 injections in FIG. 8B.

The degradation of results can be minimized by the selection of column body material. The spectra shown in FIGS. 7A-8B present results from an uncoated stainless steel column, and present the growth of the n-oxide peak with increasing exposure to the sample and mobile phase. However, by selecting a different column technology, a stainless steel column coated with an inorganic-organic hybrid material (i.e., C2), degradation of results is minimized as the oxide peak (while present) does not increase to the same extent as shown in FIG. 7A-8B. FIGS. 10A-10C provide spectra after the first, second and thirteen (respectively) on a C2 coated column. FIGS. 11A-11B illustrate the change in the n-oxide peak between the second and thirty-fourth injections.

Example 2: On-Column Oxidation of Different Frit Materials

Clozapine was prepared in 0.1% (w/v) 20/80/0.08 acetonitrile/water/acetic acid. Analysis of these samples were performed using a coated inert system (ACQUITY UPLC PREMIER LC system, commercially available from Waters Corporation, Milford MA) and the separation method outline below. FIGS. 12A-12D (after second injection) and FIGS. 13A-13D (after fifth injection) present the on-column oxidation results of the separations from multiple injections (i.e., $2^{nd}$, and $5^{th}$) in columns using different frit materials (e.g., uncoated metals such as stainless steel and titanium, and coated metals including C2 coated stainless steel frits and C2 coated titanium frits).

TABLE 4

Separation details for Example 2

| Test Conditions | |
|---|---|
| Column | Hybrid Silica C18, 130 angstroms, 1.7 μm packed within a C2 coated stainless steel 2.1 × 50 mm column; frits (A-D) evaluated by use of a single type in the column |
| Frit A | Stainless steel |
| Frit B | C2 coated stainless steel |
| Frit C | Titanium |
| Frit D | C2 coated titanium |
| Sample | 6 mg/mL Clozapine in acetonitrile/water/acetic acid |
| Solvent Conditions | |
| Solvent Line A | 0.05% (w/v) ammonium hydroxide in water |
| Solvent Line B | Acetonitrile |
| Column Temper | 30° C. |
| Injection Volume | 0.5 μL (first injection), 0.25 μL (successive injections) |
| Diluent | 20/80/0.8 (w/v) acetonitrile/water/acetic acid |
| UV Detection | 290 nm |
| MS Conditions | |
| Mode | ESI positive, sensitivity |
| Mass Range | 50-1500 m/z |
| Capillary | 3.5 kV |

TABLE 4-continued

Separation details for Example 2

| Sample Cone | 40 V |
|---|---|
| Source Offset | 80 V |
| Source Temperature | 100° C. |
| Desolvation Temperature | 250° C. |
| Desolvation Gas | 600 L/h |
| Quadrupole Option | Automatic |

Gradient Table:

| Time (min) | Flow Rate (mL/min) | % A | % B | Curve |
|---|---|---|---|---|
| Initial | 0.310 | 75.0 | 25.0 | Initial |
| 0.45 | 0.310 | 75.0 | 25.0 | 6 |
| 10.31 | 0.310 | 20.0 | 80.0 | 6 |
| 11.20 | 0.310 | 20.0 | 80.0 | 6 |
| 11.25 | 0.310 | 20.0 | 80.0 | 6 |
| 12.55 | 0.310 | 20.0 | 80.0 | 6 |
| 13.00 | 0.310 | 75.0 | 25.0 | 6 |
| 15.00 | 0.310 | 75.0 | 25.0 | 6 |

As shown in an evaluation of different frit materials used in conjunction with hybrid organic-inorganic coating (in this example C2 coating), both stainless steel and titanium frits with C2 coating technology provide reductions in on-column degradation of amine versus their corresponding non-coated fits. The separation of Clozapine, a compound known to undergo on-column oxidation with ammonium hydroxide and acetonitrile mobile phases, resulted in 50% less clozapine N-oxide using C2 coated stainless steel frits over stainless steel frits (uncoated). An 80% reduction was seen using C2 on titanium fits over titanium frits without a coating.

TABLE 5

Percentage of Oxidized Clozapine from Total Peak Area

| | Tube Material | | | |
|---|---|---|---|---|
| | SS | C2SS | C2SS | C2SS | C2SS |
| | | Frit Material | | | |
| | SS | SS | C2SS | Ti | C2Ti |
| % after 2$^{nd}$ Injection | 1.03 | 1.11 | 0.53 | 0.04 | 0.01 |
| % after 5$^{th}$ Injection | 2.08 | 1.83 | 0.9 | 0.21 | 0.41 |

SS = Stainless Steel;
Ti = Titanium;
C2SS = C2 coating on Stainless Steel;
C2Ti = C2 coating on Titanium.
See FIGS. 12A-12E and 13A-13E.

Interestingly, when comparing the performance of the frits studied, the C2 coated titanium frits produced the least amount of oxidative species followed by the column packed with titanium frits. The C2 coated stainless steel frits, while providing benefits over standard stainless steel frits, was still 77% less effective at preventing on-column oxidation than when titanium frits were used. It is reasoned that the C2 coating may not be as effectively applied to stainless steel frits and that an improved process or the addition of a metallic layer could prove more effective. Nevertheless, C2 coating yields significantly lower oxidative species and, in the case of C2 coated titanium, could even potentially prevent the formation of oxidative species, as demonstrated throughout 34 injections on a C2 stainless steel coated column with C2 coated Ti frit shown in FIG. 11B. For example, compare FIGS. 11A and 11B showing little to no growth of the oxide peak.

The results of using a masked or coated frit also show a decrease in nitrosation during the separation of Clozapine with ammonium hydroxide and acetonitrile mobile phases. While nitrosation of Clozapine was not as prominent as the oxidized form, reductions in nitrosation were also recorded. FIG. 14 A and FIG. 14 B provide the spectra at the known Clozapine nitroso impurities peaks (peaks for z and e isomers) after the second injection and thirty-fourth injection of Clozapine in an uncoated column using an uncoated stainless steel frit. As more Clozapine is injected into the system, additional nitrosation occurs. However, nitrosation is stunted in the C2 coated stainless steel column including a C2 coated titanium frit. Compare the lack of growth of the nitrosation peaks (e.g., peaks at retention times 8.52 and 8.66) in FIGS. 14A and 14B, with the lack of peaks in FIGS. 15A and 15B.

Accordingly, in other embodiments of this invention, the hybrid organic-inorganic is not restricted to C2 coatings but to any coating or ligand that can mask metal-analyte interactions. Thus, different modes of chromatography as well as various analytes (i.e., not just amines) can benefit from this protection. For example, the present technology can be used in the separation or study of any metal reactive analyte—such as for example, anilines). Alternative byproducts of degradation or metal-catalyzed reactions can also be prevented or reduced. It can be foreseen that this technology can be applied to the entire LC system or MS instrument or even different surfaces, such as sample vials or mobile phase containers, to prevent surface-catalyzed reactions that could occur within these instruments or containers.

Example 3: On-Column Oxidation of Different Column Technologies

Figure 16A:
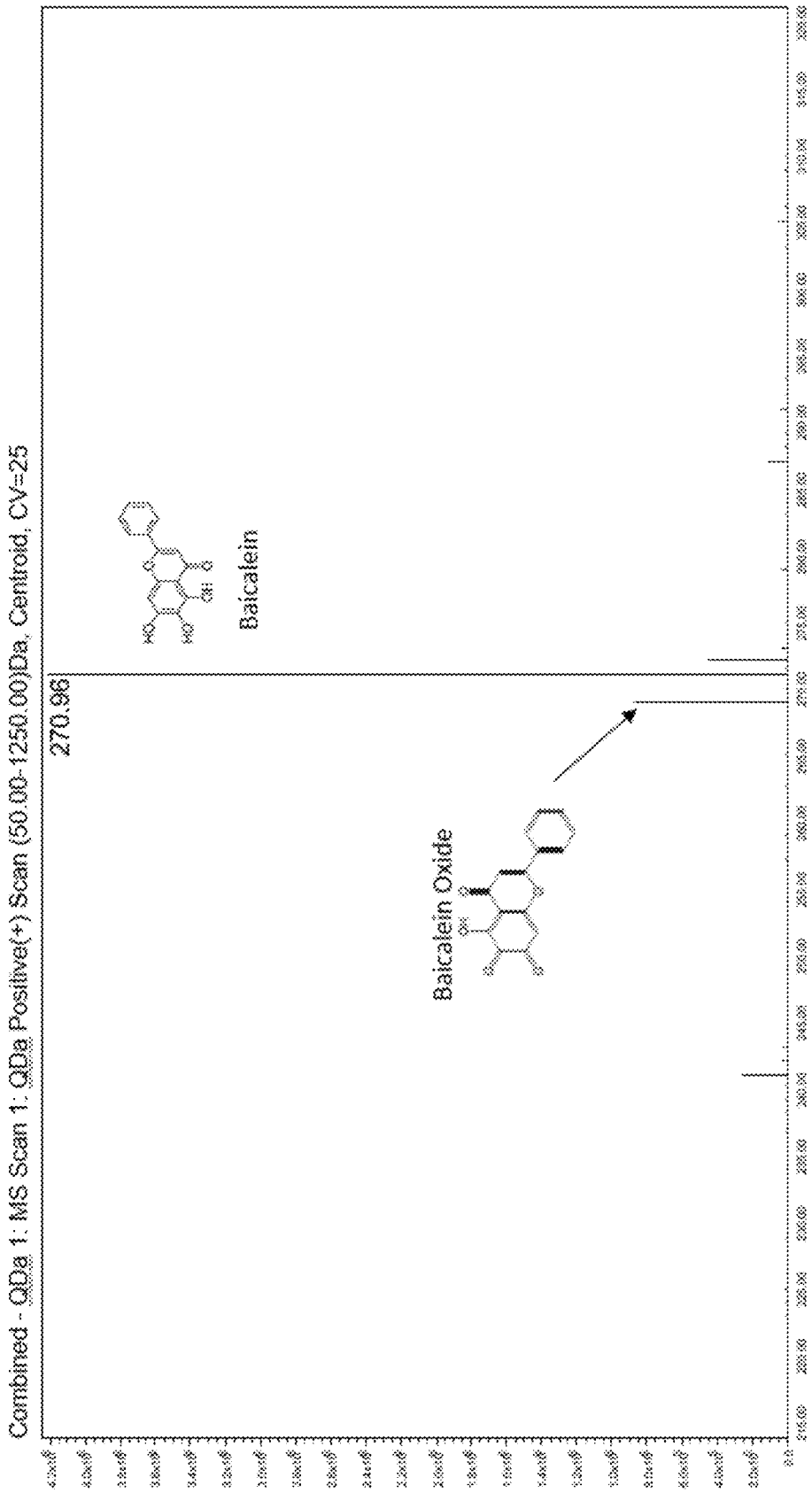
FIG. 16A is a MS spectra showing the identification of baicalein and baicalein oxide from the first injection of a sample on an uncoated stainless steel column.
Figure 16B:
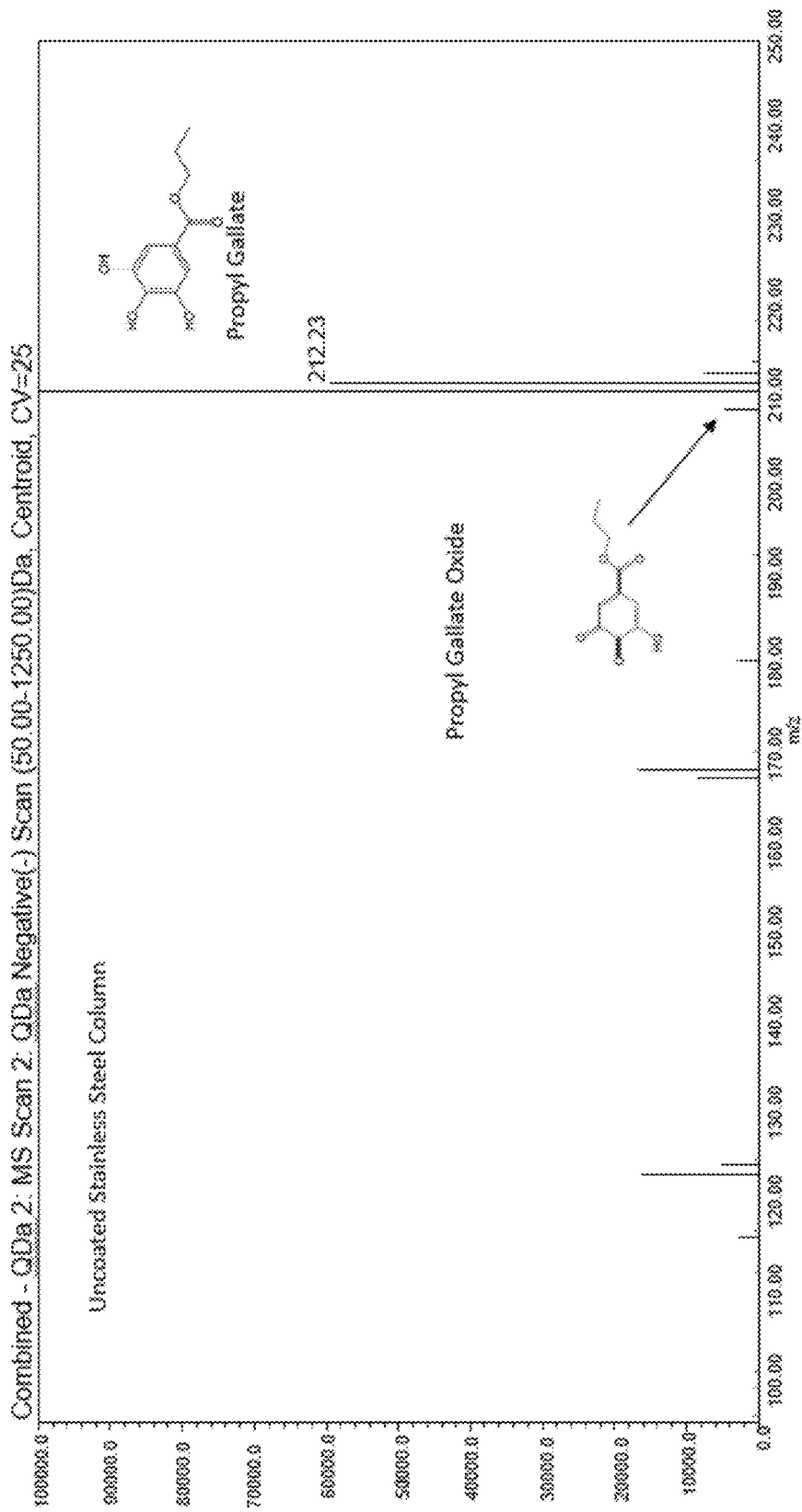
FIG. 16B is a MS spectra showing the identification of propyl gallate and propyl gallate oxide from the first injection of the sample on an uncoated stainless steel column.
Figure 16C:
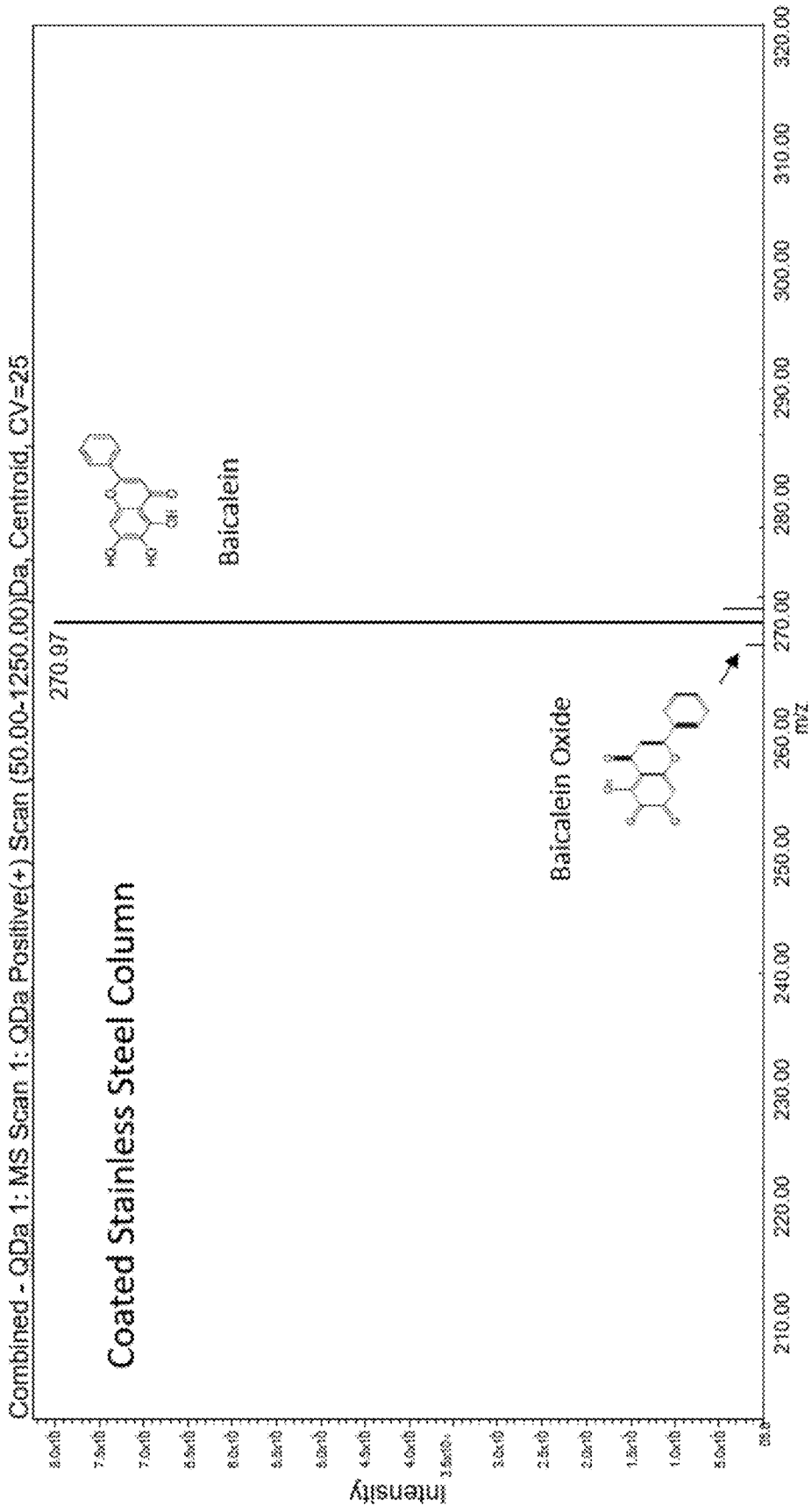
FIG. 16C is a MS spectra showing the identification of baicalein and baicalein oxide from the first injection of the sample on a C2 coated stainless steel column.
Figure 16D:
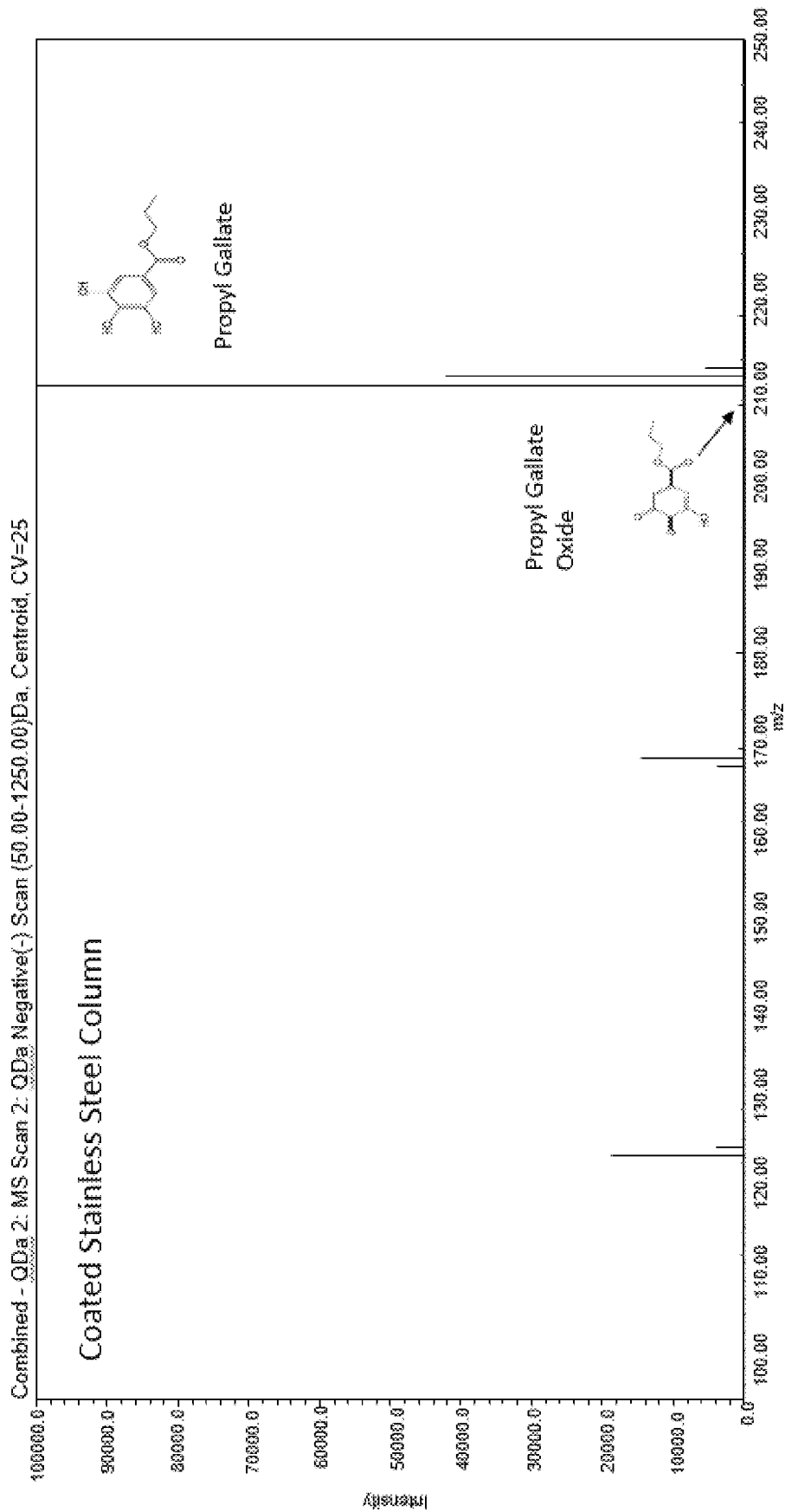
FIG. 16D is a MS spectra showing the identification of propyl gallate and propyl gallate oxide from the first injection of the sample on a C2 coated stainless steel column.

Baicalein, baicalein oxide, propyl gallate, and propyl gallate oxide were prepared in methanol/water (1:1, v/v) to create a single sample. Analyses of the sample (i.e., the analytes in the sample) were performed using a Waters ACQUITY UPLC H-Class Bio Binary system and the separation conditions outlined below using a stainless steel, uncoated column with uncoated frit (Column A) and a coated stainless steel column with coated frit (Column B). The mobile phase included acetonitrile as well as formic acid, which are known to cause polyphenol oxidation of these analytes in the presence of metals. FIGS. 16A-16B present the on-column oxidation results of the separation from the first injection on an uncoated stainless steel column (Column A); and FIGS. 16C-16D present the results on a C2 coated stainless steel column (Column B). Mass spectra are presented, with the compounds and their oxidized forms labeled in the mass spectra. These spectra show that the oxide peaks (i.e., baicalein oxide and propyl gallate oxide) are significantly greater (i.e., contain greater amount of the oxide forms) in the uncoated Column A, than in coated Column B (which included a titanium frit having a coating covering its wetted surfaces).

TABLE 6

Separation details for Example 3

Test Conditions

| Column A (Conventional) | Hybrid Silica C18, 130 angstroms, 1.7 μm packed within a stainless steel 2.1 × 50 mm column with stainless steel frit |
|---|---|

TABLE 6-continued

Separation details for Example 3

| Column B (Coated Column) | Hybrid Silica C18, 130 angstroms, 1.7 μm packed within a C2 coated stainless steel column 2.1 × 50 mm; with coated titanium frit |
| --- | --- |
| Sample | 0.1 mg/mL solutions of baicalein, baicalein oxide, propyl gallate, and propyl gallate oxide |

Solvent Conditions

| Solvent Line A | 0.1% formic acid in water |
| --- | --- |
| Solvent Line B | Acetonitrile |
| Column Temperature | 30° C. |
| Injection Volume | 0.5 μL (first injection) |
| Diluent | Methanol/water (1:1, v/v) |
| UV Detection | 280 nm |

Gradient Table:

| Time (min) | Flow Rate (mL/min) | % A | % B | Curve |
| --- | --- | --- | --- | --- |
| Initial | 0.400 | 95.0 | 5.0 | Initial |
| 10.00 | 0.400 | 30.0 | 70.0 | 6 |
| 10.10 | 0.400 | 95.0 | 5.0 | 6 |
| 12.00 | 0.400 | 95.0 | 5.0 | 6 |

What is claimed is:

1. A chromatography column, comprising:
a frit comprising a metal substrate, an intermediate coating, and an outer coating, wherein the intermediate coating is vapor deposited and disposed between the outer coating and an exterior surface of the metal substrate, the outer coating comprising an inorganic-organic hybrid, and the intermediate coating comprising a metal nitride or a metal carbide layer.

2. The chromatography column of claim 1, wherein the metal substrate comprises substantially pure titanium.

3. The chromatography column of claim 2, wherein the outer coating comprises C2 and/or C2C10.

4. The chromatography column of claim 1, wherein at least a portion of exposed metal walls housed within the chromatography column comprise a fluid-contacting coating comprising the inorganic-organic hybrid.

5. The chromatography column of claim 4, wherein the inorganic-organic hybrid comprises C2 and/or C2C10.

6. The chromatography column of claim 4, wherein the metal substrate comprises titanium.

7. A method of reducing metal-catalyzed reactions of sample components during liquid chromatography, the method comprising:
separating a sample in the chromatography column of claim 1, wherein the inorganic-organic hybrid coating is non-reactive with the sample; and
detecting separated sample components with a detector.

8. The method of claim 7, wherein the frit comprises a pure or substantially pure titanium frit.

9. The method of claim 7, wherein the frit comprises a titanium alloy frit.

10. The method of claim 7, wherein the frit comprises a stainless steel frit.

11. The method of claim 10, wherein the intermediate coating is applied prior to the inorganic-organic hybrid coating.

12. The method of claim 10, wherein the intermediate coating is applied simultaneously with the inorganic-organic hybrid coating.

13. The method of claim 7, wherein the inorganic-organic hybrid coating comprises an alkylsilyl coating.

14. The method of claim 7, wherein exposed metal walls within the chromatography column are coated with the inorganic-organic hybrid coating.

15. The method of claim 14, wherein a bioinert pump is connected to the liquid chromatography system.

16. The chromatography column of claim 1, wherein the intermediate coating comprises a silicon nitride layer.

17. A chromatography column, comprising:
a frit comprising a metal substrate, an intermediate coating, and an outer coating, wherein the intermediate coating is vapor deposited and disposed between the outer coating and an exterior surface of the metal substrate, the outer coating comprising an inorganic-organic hybrid, and the intermediate coating comprising a pure silicon, manganese, molybdenum, tin, vanadium, chromium, boron, tungsten, tantalum, or iridium layer.

18. The chromatography column of claim 17, wherein the metal substrate comprises titanium.

19. The chromatography column of claim 17, wherein the outer coating comprises C2 and/or C2C10.

20. The chromatography column of claim 19, wherein the intermediate coating comprises pure silicon.

* * * * *